(12) United States Patent
Sharman et al.

(10) Patent No.: US 12,206,853 B2
(45) Date of Patent: Jan. 21, 2025

(54) IMAGE DATA ENCODING AND DECODING

(71) Applicant: SONY GROUP CORPORATION, Tokyo (JP)

(72) Inventors: Karl James Sharman, Basingstoke (GB); Stephen Mark Keating, Basingstoke (GB); Adrian Richard Browne, Basingstoke (GB)

(73) Assignee: SONY GROUP CORPORATION, Tokyo (JP)

( * ) Notice: Subject to any disclaimer, the term of this patent is extended or adjusted under 35 U.S.C. 154(b) by 76 days.

(21) Appl. No.: 17/642,910

(22) PCT Filed: Sep. 23, 2020

(86) PCT No.: PCT/GB2020/052296
§ 371 (c)(1),
(2) Date: Mar. 14, 2022

(87) PCT Pub. No.: WO2021/058947
PCT Pub. Date: Apr. 1, 2021

(65) Prior Publication Data
US 2023/0007259 A1 Jan. 5, 2023

(30) Foreign Application Priority Data
Sep. 24, 2019 (GB) ...................................... 1913733

(51) Int. Cl.
*H04N 19/13* (2014.01)
*H04N 19/174* (2014.01)
(52) U.S. Cl.
CPC ........... *H04N 19/13* (2014.11); *H04N 19/174* (2014.11)
(58) Field of Classification Search
CPC .. H04N 19/70; H04N 19/132; H04N 19/1887; H04N 19/46
See application file for complete search history.

(56) References Cited

U.S. PATENT DOCUMENTS

2014/0286417 A1* 9/2014 Gamei ................ H03M 7/4018
375/240.12

FOREIGN PATENT DOCUMENTS

| CN | 103918272 A | 7/2014 |
|---|---|---|
| CN | 103959794 A | 7/2014 |

OTHER PUBLICATIONS

Bross et al. (JVET-N1001-v9: Versatile Video Coding (Draft 5); 2019 (Year: 2019).*

(Continued)

*Primary Examiner* — Jonathan R Messmore
(74) *Attorney, Agent, or Firm* — Oblon, McClelland, Maier & Neustadt, L.L.P.

(57) ABSTRACT

Image data encoding apparatus, comprises an entropy encoder configured to selectively encode data items representing image data so as to generate encoded binarized symbols of successive output data units; the entropy encoder being configured to generate an output data stream subject to a constraint defining an upper limit to the number of binarized symbols that may be expressed by any individual output data unit relative to the size in bytes of that output data unit, in which the entropy encoder is configured to provide padding data, for each output data unit which does not meet the constraint, so as to increase the size in bytes of that output data unit in order to meet the constraint; the apparatus comprising: an attribute detector configured to detect an encoding attribute applicable to a given output data unit; and a selector configured to select, in response to the detected encoding attribute, a constraint, for use with the given output data unit, from two or more candidate constraints.

19 Claims, 12 Drawing Sheets

(56) References Cited

OTHER PUBLICATIONS

H.265; Series H: Audiovisual and multimedia systems; HEVC; Apr. 2013 (Year: 2013).*
Chen et al. (A deeply pipelined CABAC decoder for HEVC supporting 6.2 high-tier applications) (Year: 2013).*
International Search Report issued Nov. 30, 2020 in PCT/GB2020/052296 filed Sep. 23, 2020, 4 pages.
Yu-Hsin Chen et al., "A deeply pipelined CABAC decoder for HEVC supporting level 6.2 high-tier applications", IEEE Transactions on Circuits and Systems for Video Technology, Institute Of Electrical And Electronics Engineers, US, vol. 25, No. 5, May 2015 (May 1, 2015), pp. 856-868, XP011580042, DOI: 10.1109/TCSVT.2014.2363748 [retrieved on May 1, 2015].
Benjamin Bross et al., "WD4: Working Draft 4 of High-Efficiency Video Coding ", Editor, Joint Collaborative Team on Video Coding (JCT-VC) of ITU-T SG16 WP3 and ISO/IEC JTC1/SC29/WG11, 6th Meeting: Torino, IT, Jul. 14-22, 2011 JCTVC-F803_d5, Oct. 28, 2011.
Benjamin Bross et al., "High Efficiency Video Coding (HEVC) text specification draft 6", Editor, Joint Collaborative Team on Video Coding (JCT-VC) of ITU-T SG16 WP3 and ISO/IEC JTC1/SC29/WG11, 7th Meeting: Geneva, CH, Nov. 21-30, 2011, JCTVC-H1003_d0 Feb. 10, 2012.
Adrian Browne et al., "CABAC zero word thresholds", Sony Europe BV, Joint Video Experts Team (JVET) of ITU-T SG 16 WP 3 and ISO/IEC JTC 1/SC 29/WG 11, 16th Meeting: Geneva, CH, Oct. 1-11, 2019, JVET-P0395, XP030217181, retrieved from the Internet: URL:http:// phenix.int-evry.fr/jvet/doc end_user/documents/16 Geneva/wgll/JVET-P0395- v2.zip JVET P0395/JVET-P0395 v2.DOCX.
Benjamin Bross et al., "Versatile Video Coding (Draft 5) ", Editors, Joint Video Experts Team (JVET) of ITU-T SG 16 WP 3 and ISO/IEC JTC 1/SC 29/WG 11, 14th Meeting: Geneva, CH, Mar. 19-27, 2019, JVET-N1001-v10 Jul. 2, 2019.
Adrian Browne et al., "Slice/tile level CABAC zero-word constraints", Sony Europe BV, Joint Video Experts Team (JVET) of ITU-T SG 16 WP 3 and ISO/IEC JTC 1/SC 29/WG 11,15th Meeting: Gothenburg, SE, Jul. 3-12, 2019, JVET-O0517, Jul. 4, 2019, XP030219791, Retrieved from the Internet: URL:http://phenix.int-evry.fr/jvet/doc_end_user/documents/15Gothenburg/wgll/JVET-O0 517-V2 .zip JVET-O0517/JVET-O0517_v2.DOCX [retrieved on Jul. 4, 2019].
Adrian Browne et al., "GT1 flag coding ", Sony Europe BV , Joint Video Experts Team (JVET) of ITU-T SG 16 WP 3 and ISO/IEC JTC 1/SC 29/WG11,15th Meeting: Gothenburg, SE, Jul. 3-12, 2019 JVET-O0520, Jul. 4, 2019, XP030219800, Retrieved from the Internet: URL:http://phenix.int-evry.fr/jvet/doc end_user/documents/15 Gothenburg/wgll/JVET-O0 520- v2.zip JVET-O0520/JVET-O0520 v2.DOCX.
Gary Sullivan et al., "Meeting Report of the 15th Meeting of the Joint Video Experts Team (JVET)", Chairs of JVET, Joint Video Experts Team (JVET) of ITU-T SG 16 WP 3 and ISO/IEC JTC 1/SC 29/WG 11, 15th Meeting: Gothenburg, SE, Jul. 3-12, 2019, JVET-O2000, Gothenburg, SE, Jul. 3-12, 2019, Sep. 30, 2019, XP055695273, Retrieved from the Internet: URL:http://phenix.int-evry.fr/jvet/doc end_user/current -document.php?id=7825 [retrieved on May 14, 2020].
Bross B et al: "Versatile Video Coding (Draft 5)", No. JVET-N1001 v7, JVET Meeting; Mar. 19, 2019-Mar. 27, 2019; Geneva, (The Joint Video Exploration Team of ISO/IEC JTC1/SC29/WG11 and ITU-T SG.16 ), pp. 1-383, XP030205196, Retrieved from the Internet: URL:http://phenix.int-evry.fr/jvet/doc_end_user/documents/14_ Geneva/wg 11 / JVET-N1001-v7.zip [retrieved on May 29, 2019].
Office Action dated Nov. 26, 2024, issued in counterpart JP Application No. 2022-517356, with English Translation, (10 pages).
Okubo et al., "3rd Edition of Revision H.264 / AVC Textbook", 1st Edition, Jan. 1, 2009, Impress Corporation R&D, the 86-88th, pp. 99-107, 148-162, 231-240. (relevant English Translation of text in JP Office Action dated Nov. 26, 2024) (45 pages).

* cited by examiner

IMAGE DATA ENCODING AND DECODING

BACKGROUND

Field

This disclosure relates to image data encoding and decoding.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly or impliedly admitted as prior art against the present disclosure.

There are several video data encoding and decoding systems which involve transforming video data into a frequency domain representation, quantising the frequency domain coefficients and then applying some form of entropy encoding to the quantised coefficients. This can achieve compression of the video data. A corresponding decoding or decompression technique is applied to recover a reconstructed version of the original video data.

High Efficiency Video Coding (HEVC), also known as H.265 or MPEG-H Part 2, is a proposed successor to H.264/MPEG-4 AVC. It is intended for HEVC to improve video quality and double the data compression ratio compared to H.264, and for it to be scalable from 128×96 to 7680×4320 pixels resolution, roughly equivalent to bit rates ranging from 128 kbit/s to 800 Mbit/s.

SUMMARY

The present disclosure addresses or mitigates problems arising from this processing.

The present disclosure provides image data encoding apparatus, comprising:
  an entropy encoder configured to selectively encode data items representing image data so as to generate encoded binarized symbols of successive output data units;
  the entropy encoder being configured to generate an output data stream subject to a constraint defining an upper limit to the number of binarized symbols that may be expressed by any individual output data unit relative to the size in bytes of that output data unit, in which the entropy encoder is configured to provide padding data, for each output data unit which does not meet the constraint, so as to increase the size in bytes of that output data unit in order to meet the constraint;
  the apparatus comprising:
  an attribute detector configured to detect an encoding attribute applicable to a given output data unit; and
  a selector configured to select, in response to the detected encoding attribute, a constraint, for use with the given output data unit, from two or more candidate constraints.

The present disclosure also provides an image data encoding method, comprising:
  selectively encoding data items representing image data so as to generate encoded binarized symbols of successive output data units;
  generating an output data stream subject to a constraint defining an upper limit to the number of binarized symbols that may be expressed by any individual output data unit relative to the size in bytes of that output data unit;
  providing padding data, for each output data unit which does not meet the constraint, so as to increase the size in bytes of that output data unit in order to meet the constraint;
  detecting an encoding attribute applicable to a given output data unit; and
  selecting, in response to the detected encoding attribute, a constraint, for use with the given output data unit, from two or more candidate constraints.

The present disclosure also provides a suitable decoding apparatus to decode a data signal generated by the method or apparatus defined above.

Further respective aspects and features of the present disclosure are defined in the appended claims.

It is to be understood that both the foregoing general description and the following detailed description are exemplary, but are not restrictive, of the present technology.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
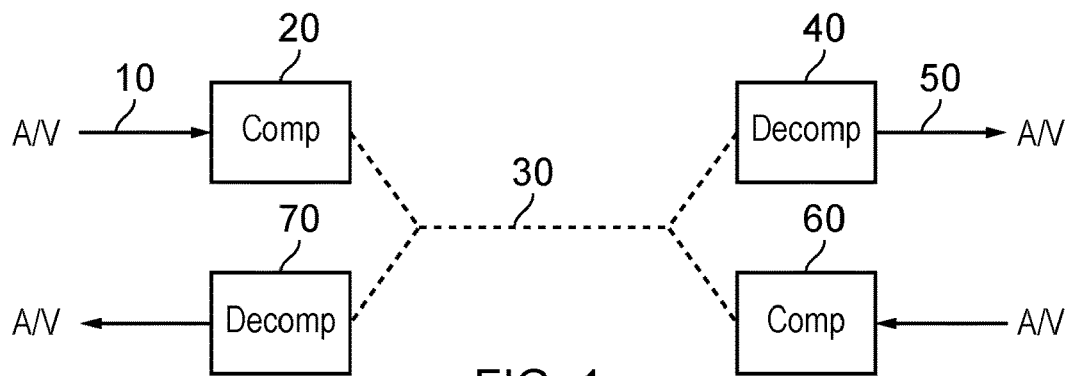
FIG. 1 schematically illustrates an audio/video (A/V) data transmission and reception system using video data compression and decompression.

Referring now to the drawings, FIGS. 1-4 are provided to give schematic illustrations of apparatus or systems making use of the compression and/or decompression apparatus to be described below in connection with embodiments of the present technology.

All of the data compression and/or decompression apparatus to be described below may be implemented in hardware, in software running on a general-purpose data processing apparatus such as a general-purpose computer, as programmable hardware such as an application specific integrated circuit (ASIC) or field programmable gate array (FPGA) or as combinations of these. In cases where the embodiments are implemented by software and/or firmware, it will be appreciated that such software and/or firmware, and non-transitory data storage media by which such software and/or firmware are stored or otherwise provided, are considered as embodiments of the present technology.

FIG. 1 schematically illustrates an audio/video data transmission and reception system using video data compression and decompression.

An input audio/video signal 10 is supplied to a video data compression apparatus 20 which compresses at least the video component of the audio/video signal 10 for transmission along a transmission route 30 such as a cable, an optical fibre, a wireless link or the like. The compressed signal is processed by a decompression apparatus 40 to provide an output audio/video signal 50. For the return path, a compression apparatus 60 compresses an audio/video signal for transmission along the transmission route 30 to a decompression apparatus 70.

The compression apparatus 20 and decompression apparatus 70 can therefore form one node of a transmission link. The decompression apparatus 40 and decompression apparatus 60 can form another node of the transmission link. Of course, in instances where the transmission link is uni-directional, only one of the nodes would require a compression apparatus and the other node would only require a decompression apparatus.

Figure 2:
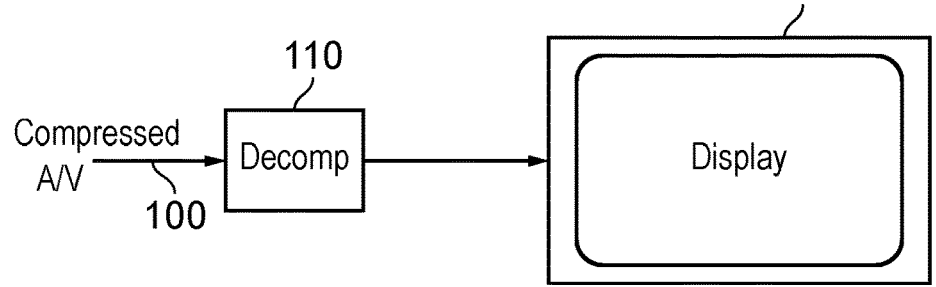
FIG. 2 schematically illustrates a video display system using video data decompression.

FIG. 2 schematically illustrates a video display system using video data decompression. In particular, a compressed audio/video signal 100 is processed by a decompression apparatus 110 to provide a decompressed signal which can be displayed on a display 120. The decompression apparatus 110 could be implemented as an integral part of the display 120, for example being provided within the same casing as the display device. Alternatively, the decompression apparatus 110 maybe provided as (for example) a so-called set top box (STB), noting that the expression "set-top" does not imply a requirement for the box to be sited in any particular orientation or position with respect to the display 120; it is simply a term used in the art to indicate a device which is connectable to a display as a peripheral device.

Figure 3:
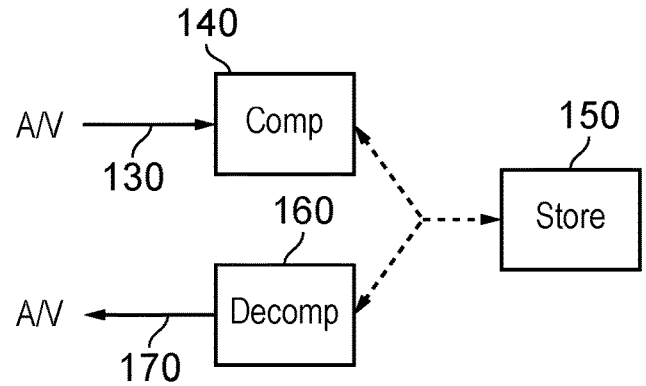
FIG. 3 schematically illustrates an audio/video storage system using video data compression and decompression.

FIG. 3 schematically illustrates an audio/video storage system using video data compression and decompression. An input audio/video signal 130 is supplied to a compression apparatus 140 which generates a compressed signal for storing by a store device 150 such as a magnetic disk device, an optical disk device, a magnetic tape device, a solid state storage device such as a semiconductor memory or other storage device. For replay, compressed data is read from the storage device 150 and passed to a decompression apparatus 160 for decompression to provide an output audio/video signal 170.

It will be appreciated that the compressed or encoded signal, and a storage medium such as a machine-readable non-transitory storage medium, storing that signal, are considered as embodiments of the present technology.

Figure 4:
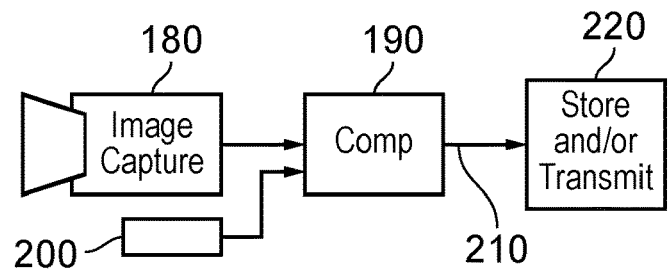
FIG. 4 schematically illustrates a video camera using video data compression.

FIG. 4 schematically illustrates a video camera using video data compression. In FIG. 4, an image capture device 180, such as a charge coupled device (CCD) image sensor and associated control and read-out electronics, generates a video signal which is passed to a compression apparatus 190. A microphone (or plural microphones) 200 generates an audio signal to be passed to the compression apparatus 190. The compression apparatus 190 generates a compressed audio/video signal 210 to be stored and/or transmitted (shown generically as a schematic stage 220).

The techniques to be described below relate primarily to video data compression and decompression. It will be appreciated that many existing techniques may be used for audio data compression in conjunction with the video data compression techniques which will be described, to generate a compressed audio/video signal. Accordingly, a separate discussion of audio data compression will not be provided. It will also be appreciated that the data rate associated with video data, in particular broadcast quality video data, is generally very much higher than the data rate associated with audio data (whether compressed or uncompressed). It will therefore be appreciated that uncompressed audio data could accompany compressed video data to form a compressed audio/video signal. It will further be appreciated that although the present examples (shown in FIGS. 1-4) relate to audio/video data, the techniques to be described below can find use in a system which simply deals with (that is to say, compresses, decompresses, stores, displays and/or transmits) video data. That is to say, the embodiments can apply to video data compression without necessarily having any associated audio data handling at all.

FIG. 4 therefore provides an example of a video capture apparatus comprising an image sensor and an encoding apparatus of the type to be discussed below. FIG. 2 therefore provides an example of a decoding apparatus of the type to be discussed below and a display to which the decoded images are output.

A combination of FIGS. 2 and 4 may provide a video capture apparatus comprising an image sensor 180 and encoding apparatus 190, decoding apparatus 110 and a display 120 to which the decoded images are output.

Figure 5:
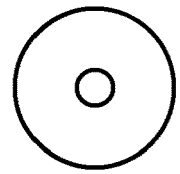
FIGS. 5 and 6 schematically illustrate storage media.
Figure 6:

FIGS. 5 and 6 schematically illustrate storage media, which store (for example) the compressed data generated by the apparatus 20, 60, the compressed data input to the apparatus 110 or the storage media or stages 150, 220. FIG. 5 schematically illustrates a disc storage medium such as a magnetic or optical disc, and FIG. 6 schematically illustrates a solid state storage medium such as a flash memory. Note that FIGS. 5 and 6 can also provide examples of non-transitory machine-readable storage media which store computer software which, when executed by a computer, causes the computer to carry out one or more of the methods to be discussed below.

Therefore, the above arrangements provide examples of video storage, capture, transmission or reception apparatuses embodying any of the present techniques.

Figure 7:
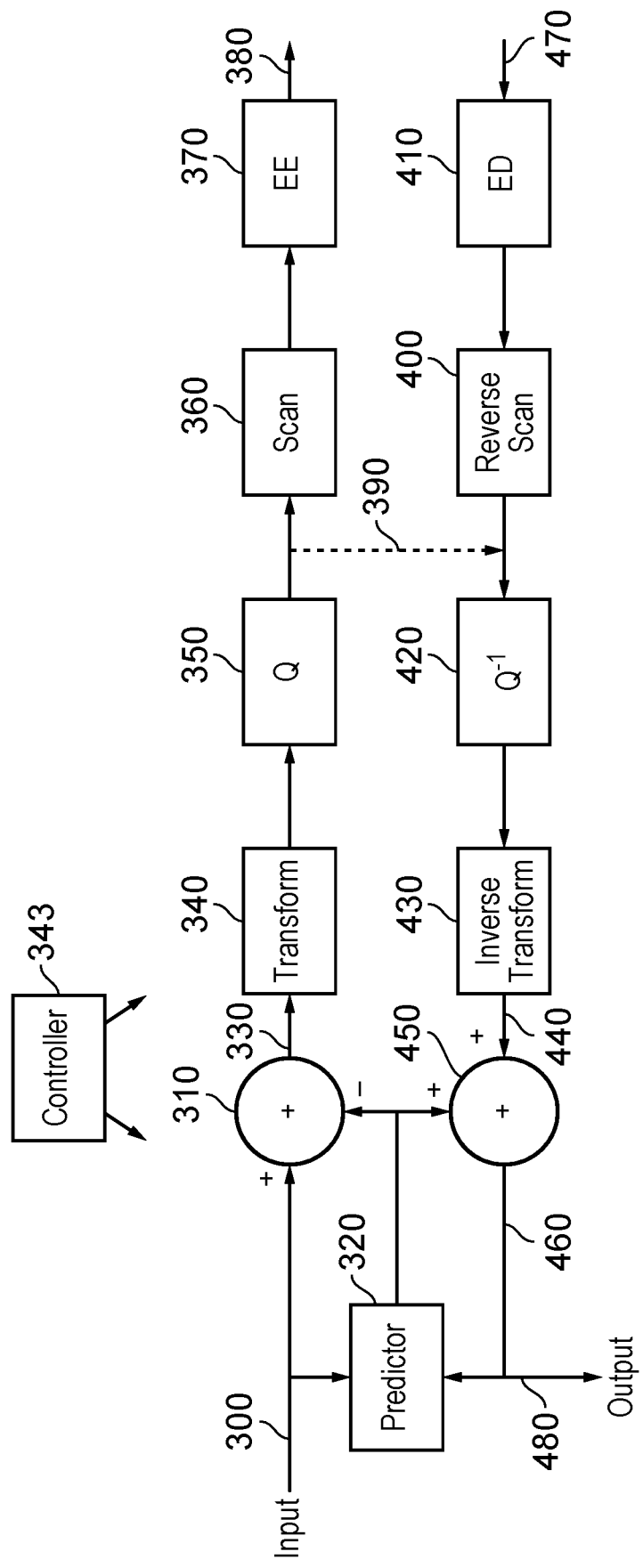
FIG. 7 provides a schematic overview of a video data compression and decompression apparatus.

FIG. 7 provides a schematic overview of a video data compression and decompression apparatus.

A controller 343 controls the overall operation of the apparatus and, in particular when referring to a compression mode, controls a trial encoding processes by acting as a selector to select various modes of operation such as block sizes and shapes, and whether the video data is to be encoded losslessly or otherwise. The controller is considered to part of the image encoder or image decoder (as the case may be). Successive images of an input video signal 300 are supplied to an adder 310 and to an image predictor 320. The image predictor 320 will be described below in more detail with reference to FIG. 8. The image encoder or decoder (as the case may be) plus the intra-image predictor of FIG. 8 may use features from the apparatus of FIG. 7. This does not mean that the image encoder or decoder necessarily requires every feature of FIG. 7 however.

The adder 310 in fact performs a subtraction (negative addition) operation, in that it receives the input video signal 300 on a "+" input and the output of the image predictor 320 on a "−" input, so that the predicted image is subtracted from the input image. The result is to generate a so-called residual image signal 330 representing the difference between the actual and projected images.

One reason why a residual image signal is generated is as follows. The data coding techniques to be described, that is to say the techniques which will be applied to the residual image signal, tend to work more efficiently when there is less "energy" in the image to be encoded. Here, the term "efficiently" refers to the generation of a small amount of encoded data; for a particular image quality level, it is desirable (and considered "efficient") to generate as little data as is practicably possible. The reference to "energy" in the residual image relates to the amount of information contained in the residual image. If the predicted image were to be identical to the real image, the difference between the two (that is to say, the residual image) would contain zero information (zero energy) and would be very easy to encode into a small amount of encoded data. In general, if the prediction process can be made to work reasonably well such that the predicted image content is similar to the image content to be encoded, the expectation is that the residual image data will contain less information (less energy) than the input image and so will be easier to encode into a small amount of encoded data.

The remainder of the apparatus acting as an encoder (to encode the residual or difference image) will now be described. The residual image data 330 is supplied to a transform unit or circuitry 340 which generates a discrete cosine transform (DCT) representation of blocks or regions of the residual image data. The DCT technique itself is well known and will not be described in detail here. Note also that the use of DCT is only illustrative of one example arrangement. Other transforms which might be used include, for example, the discrete sine transform (DST). A transform could also comprise a sequence or cascade of individual transforms, such as an arrangement in which one transform is followed (whether directly or not) by another transform. The choice of transform may be determined explicitly and/or be dependent upon side information used to configure the encoder and decoder.

The output of the transform unit 340, which is to say, a set of DCT coefficients for each transformed block of image data, is supplied to a quantiser 350. Various quantisation techniques are known in the field of video data compression, ranging from a simple multiplication by a quantisation scaling factor through to the application of complicated lookup tables under the control of a quantisation parameter. The general aim is twofold. Firstly, the quantisation process reduces the number of possible values of the transformed data. Secondly, the quantisation process can increase the likelihood that values of the transformed data are zero. Both of these can make the entropy encoding process, to be described below, work more efficiently in generating small amounts of compressed video data.

A data scanning process is applied by a scan unit 360. The purpose of the scanning process is to reorder the quantised transformed data so as to gather as many as possible of the non-zero quantised transformed coefficients together, and of course therefore to gather as many as possible of the zero-valued coefficients together. These features can allow so-called run-length coding or similar techniques to be applied efficiently. So, the scanning process involves selecting coefficients from the quantised transformed data, and in particular from a block of coefficients corresponding to a block of image data which has been transformed and quantised, according to a "scanning order" so that (a) all of the coefficients are selected once as part of the scan, and (b) the scan tends to provide the desired reordering. One example scanning order which can tend to give useful results is a so-called up-right diagonal scanning order.

The scanned coefficients are then passed to an entropy encoder (EE) 370. Again, various types of entropy encoding may be used. Two examples are variants of the so-called CABAC (Context Adaptive Binary Arithmetic Coding) system and variants of the so-called CAVLC (Context Adaptive Variable-Length Coding) system. In general terms, CABAC is considered to provide a better efficiency, and in some studies has been shown to provide a 10-20% reduction in the quantity of encoded output data for a comparable image quality compared to CAVLC. However, CAVLC is considered to represent a much lower level of complexity (in terms of its implementation) than CABAC. Note that the scanning process and the entropy encoding process are shown as separate processes, but in fact can be combined or treated together. That is to say, the reading of data into the entropy encoder can take place in the scan order. Corresponding considerations apply to the respective inverse processes to be described below.

The output of the entropy encoder 370, along with additional data (mentioned above and/or discussed below), for example defining the manner in which the predictor 320 generated the predicted image, provides a compressed output video signal 380.

However, a return path is also provided because the operation of the predictor 320 itself depends upon a decompressed version of the compressed output data.

The reason for this feature is as follows. At the appropriate stage in the decompression process (to be described below) a decompressed version of the residual data is generated. This decompressed residual data has to be added to a predicted image to generate an output image (because the original residual data was the difference between the input image and a predicted image). In order that this process is comparable, as between the compression side and the decompression side, the predicted images generated by the predictor 320 should be the same during the compression process and during the decompression process. Of course, at decompression, the apparatus does not have access to the original input images, but only to the decompressed images. Therefore, at compression, the predictor 320 bases its prediction (at least, for inter-image encoding) on decompressed versions of the compressed images.

The entropy encoding process carried out by the entropy encoder 370 is considered (in at least some examples) to be "lossless", which is to say that it can be reversed to arrive at exactly the same data which was first supplied to the entropy encoder 370. So, in such examples the return path can be implemented before the entropy encoding stage. Indeed, the scanning process carried out by the scan unit 360 is also considered lossless, but in the present embodiment the return path 390 is from the output of the quantiser 350 to the input of a complimentary inverse quantiser 420. In instances where loss or potential loss is introduced by a stage, that stage may be included in the feedback loop formed by the return path. For example, the entropy encoding stage can at least in principle be made lossy, for example by techniques in which bits are encoded within parity information. In such an instance, the entropy encoding and decoding should form part of the feedback loop.

In general terms, an entropy decoder 410, the reverse scan unit 400, an inverse quantiser 420 and an inverse transform unit or circuitry 430 provide the respective inverse functions of the entropy encoder 370, the scan unit 360, the quantiser 350 and the transform unit 340. For now, the discussion will continue through the compression process; the process to decompress an input compressed video signal will be discussed separately below.

In the compression process, the scanned coefficients are passed by the return path 390 from the quantiser 350 to the inverse quantiser 420 which carries out the inverse operation of the scan unit 360. An inverse quantisation and inverse transformation process are carried out by the units 420, 430 to generate a compressed-decompressed residual image signal 440.

The image signal 440 is added, at an adder 450, to the output of the predictor 320 to generate a reconstructed output image 460. This forms one input to the image predictor 320, as will be described below.

Turning now to the process applied to decompress a received compressed video signal 470, the signal is supplied to the entropy decoder 410 and from there to the chain of the reverse scan unit 400, the inverse quantiser 420 and the inverse transform unit 430 before being added to the output of the image predictor 320 by the adder 450. So, at the decoder side, the decoder reconstructs a version of the residual image and then applies this (by the adder 450) to the predicted version of the image (on a block by block basis) so as to decode each block. In straightforward terms, the output 460 of the adder 450 forms the output decompressed video signal 480. In practice, further filtering may optionally be applied (for example, by a filter 560 shown in FIG. 8 but omitted from FIG. 7 for clarity of the higher level diagram of FIG. 7) before the signal is output.

Figure 8:
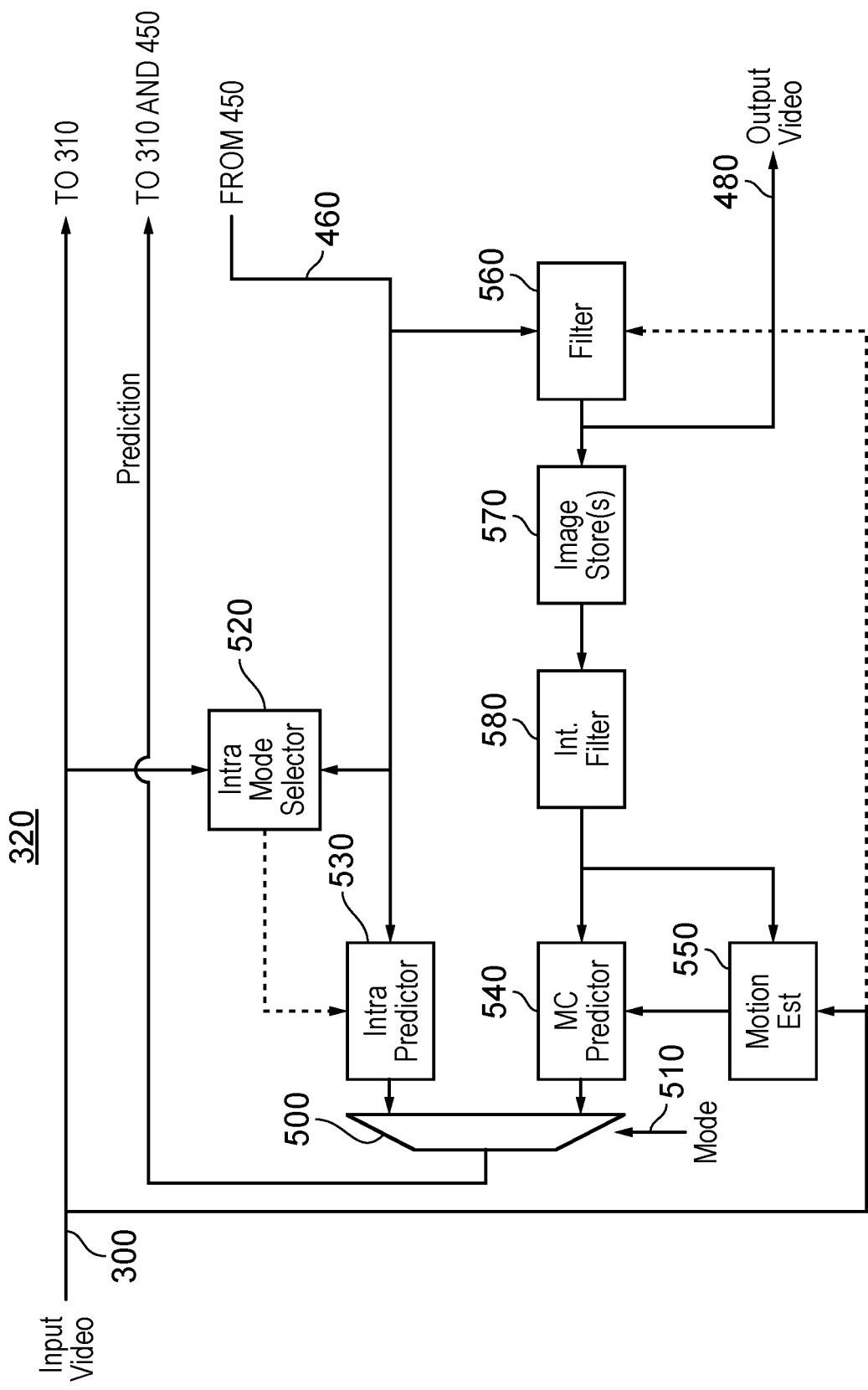
FIG. 8 schematically illustrates a predictor.

The apparatus of FIGS. 7 and 8 can act as a compression (encoding) apparatus or a decompression (decoding) apparatus. The functions of the two types of apparatus substantially overlap. The scan unit 360 and entropy encoder 370 are not used in a decompression mode, and the operation of the predictor 320 (which will be described in detail below) and other units follow mode and parameter information contained in the received compressed bit-stream rather than generating such information themselves.

FIG. 8 schematically illustrates the generation of predicted images, and in particular the operation of the image predictor 320.

There are two basic modes of prediction carried out by the image predictor 320: so-called intra-image prediction and so-called inter-image, or motion-compensated (MC), prediction. At the encoder side, each involves detecting a prediction direction in respect of a current block to be predicted, and generating a predicted block of samples according to other samples (in the same (intra) or another (inter) image). By virtue of the units 310 or 450, the difference between the predicted block and the actual block is encoded or applied so as to encode or decode the block respectively.

(At the decoder, or at the reverse decoding side of the encoder, the detection of a prediction direction may be in response to data associated with the encoded data by the encoder, indicating which direction was used at the encoder. Or the detection may be in response to the same factors as those on which the decision was made at the encoder).

Intra-image prediction bases a prediction of the content of a block or region of the image on data from within the same image. This corresponds to so-called I-frame encoding in other video compression techniques. In contrast to I-frame encoding, however, which involves encoding the whole image by intra-encoding, in the present embodiments the choice between intra- and inter-encoding can be made on a block-by-block basis, though in other embodiments the choice is still made on an image-by-image basis.

Motion-compensated prediction is an example of inter-image prediction and makes use of motion information which attempts to define the source, in another adjacent or nearby image, of image detail to be encoded in the current image. Accordingly, in an ideal example, the contents of a block of image data in the predicted image can be encoded very simply as a reference (a motion vector) pointing to a corresponding block at the same or a slightly different position in an adjacent image.

A technique known as "block copy" prediction is in some respects a hybrid of the two, as it uses a vector to indicate a block of samples at a position displaced from the currently predicted block within the same image, which should be copied to form the currently predicted block.

Returning to FIG. 8, two image prediction arrangements (corresponding to intra- and inter-image prediction) are shown, the results of which are selected by a multiplexer 500 under the control of a mode signal 510 (for example, from the controller 343) so as to provide blocks of the predicted image for supply to the adders 310 and 450. The choice is made in dependence upon which selection gives the lowest "energy" (which, as discussed above, may be considered as information content requiring encoding), and the choice is signalled to the decoder within the encoded output datastream. Image energy, in this context, can be detected, for example, by carrying out a trial subtraction of an area of the two versions of the predicted image from the input image, squaring each pixel value of the difference image, summing the squared values, and identifying which of the two versions gives rise to the lower mean squared value of the difference image relating to that image area. In other examples, a trial encoding can be carried out for each selection or potential selection, with a choice then being made according to the cost of each potential selection in terms of one or both of the number of bits required for encoding and distortion to the picture.

The actual prediction, in the intra-encoding system, is made on the basis of image blocks received as part of the signal 460, which is to say, the prediction is based upon encoded-decoded image blocks in order that exactly the same prediction can be made at a decompression apparatus. However, data can be derived from the input video signal 300 by an intra-mode selector 520 to control the operation of the intra-image predictor 530.

For inter-image prediction, a motion compensated (MC) predictor 540 uses motion information such as motion vectors derived by a motion estimator 550 from the input video signal 300. Those motion vectors are applied to a processed version of the reconstructed image 460 by the motion compensated predictor 540 to generate blocks of the inter-image prediction.

Accordingly, the units 530 and 540 (operating with the estimator 550) each act as detectors to detect a prediction direction in respect of a current block to be predicted, and as a generator to generate a predicted block of samples (forming part of the prediction passed to the units 310 and 450) according to other samples defined by the prediction direction.

The processing applied to the signal 460 will now be described. Firstly, the signal is optionally filtered by a filter unit 560, which will be described in greater detail below. This involves applying a "deblocking" filter to remove or at least tend to reduce the effects of the block-based processing carried out by the transform unit 340 and subsequent operations. A sample adaptive offsetting (SAO) filter may also be used. Also, an adaptive loop filter is optionally applied using coefficients derived by processing the reconstructed signal 460 and the input video signal 300. The adaptive loop filter is a type of filter which, using known techniques, applies adaptive filter coefficients to the data to be filtered. That is to say, the filter coefficients can vary in dependence upon various factors. Data defining which filter coefficients to use is included as part of the encoded output data-stream.

The filtered output from the filter unit 560 in fact forms the output video signal 480 when the apparatus is operating as a decompression apparatus. It is also buffered in one or more image or frame stores 570; the storage of successive images is a requirement of motion compensated prediction processing, and in particular the generation of motion vectors. To save on storage requirements, the stored images in the image stores 570 may be held in a compressed form and then decompressed for use in generating motion vectors. For this particular purpose, any known compression/decompression system may be used. The stored images are passed to an interpolation filter 580 which generates a higher resolution version of the stored images; in this example, intermediate samples (sub-samples) are generated such that the resolution of the interpolated image is output by the interpolation filter 580 is 4 times (in each dimension) that of the images stored in the image stores 570 for the luminance channel of 4:2:0 and 8 times (in each dimension) that of the images stored in the image stores 570 for the chrominance channels of 4:2:0. The interpolated images are passed as an input to the motion estimator 550 and also to the motion compensated predictor 540.

The way in which an image is partitioned for compression processing will now be described. At a basic level, an image to be compressed is considered as an array of blocks or regions of samples. The splitting of an image into such blocks or regions can be carried out by a decision tree, such as that described in Bross et al: "High Efficiency Video Coding (HEVC) text specification draft 6", JCTVC-H1003_d0 (November 2011), the contents of which are incorporated herein by reference. In some examples, the resulting blocks or regions have sizes and, in some cases, shapes which, by virtue of the decision tree, can generally follow the disposition of image features within the image. This in itself can allow for an improved encoding efficiency because samples representing or following similar image features would tend to be grouped together by such an arrangement. In some examples, square blocks or regions of different sizes (such as 4×4 samples up to, say, 64×64 or larger blocks) are available for selection. In other example arrangements, blocks or regions of different shapes such as rectangular blocks (for example, vertically or horizontally oriented) can be used. Other non-square and non-rectangular blocks are envisaged. The result of the division of the image into such blocks or regions is (in at least the present examples) that each sample of an image is allocated to one, and only one, such block or region.

The intra-prediction process will now be discussed. In general terms, intra-prediction involves generating a prediction of a current block of samples from previously-encoded and decoded samples in the same image.

Figure 9:
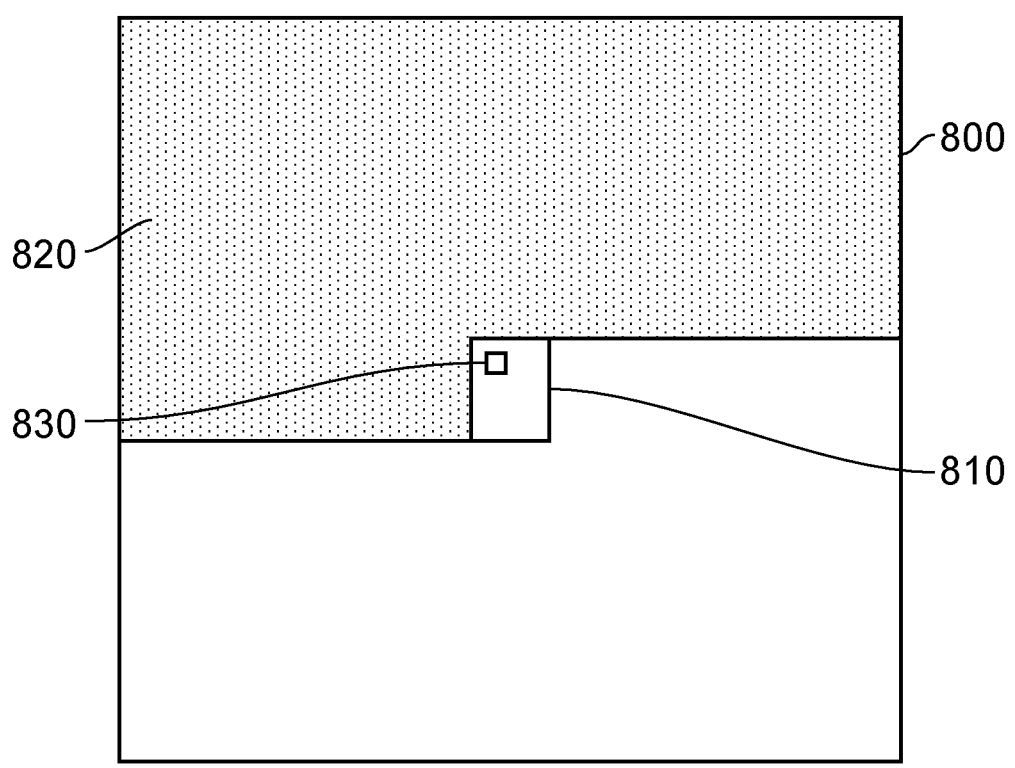
FIG. 9 schematically illustrates a partially-encoded image.

FIG. 9 schematically illustrates a partially encoded image 800. Here, the image is being encoded from top-left to bottom-right on a block by block basis. An example block encoded partway through the handling of the whole image is shown as a block 810. A shaded region 820 above and to the left of the block 810 has already been encoded. The intra-image prediction of the contents of the block 810 can make use of any of the shaded area 820 but cannot make use of the unshaded area below that.

In some examples, the image is encoded on a block by block basis such that larger blocks (referred to as coding units or CUs) are encoded in an order such as the order discussed with reference to FIG. 9. Within each CU, there is the potential (depending on the block splitting process that has taken place) for the CU to be handled as a set of two or more smaller blocks or transform units (TUs). This can give a hierarchical order of encoding so that the image is encoded on a CU by CU basis, and each CU is potentially encoded on a TU by TU basis. Note however that for an individual TU within the current coding tree unit (the largest node in the tree structure of block division), the hierarchical order of encoding (CU by CU then TU by TU) discussed above means that there may be previously encoded samples in the current CU and available to the coding of that TU which are, for example, above-right or below-left of that TU.

The block 810 represents a CU; as discussed above, for the purposes of intra-image prediction processing, this may be subdivided into a set of smaller units. An example of a current TU 830 is shown within the CU 810. More generally, the picture is split into regions or groups of samples to allow efficient coding of signalling information and transformed data. The signalling of the information may require a different tree structure of sub-divisions to that of the transform, and indeed that of the prediction information or the prediction itself. For this reason, the coding units may have a different tree structure to that of the transform blocks or regions, the prediction blocks or regions and the prediction information. In some examples such as HEVC the structure can be a so-called quad tree of coding units, whose leaf nodes contain one or more prediction units and one or more transform units; the transform units can contain multiple transform blocks corresponding to luma and chroma representations of the picture, and prediction could be considered to be applicable at the transform block level. In examples, the parameters applied to a particular group of samples can be considered to be predominantly defined at a block level, which is potentially not of the same granularity as the transform structure.

The intra-image prediction takes into account samples coded prior to the current TU being considered, such as those above and/or to the left of the current TU. Source samples, from which the required samples are predicted, may be located at different positions or directions relative to the current TU. To decide which direction is appropriate for a current prediction unit, the mode selector 520 of an example encoder may test all combinations of available TU structures for each candidate direction and select the prediction direction and TU structure with the best compression efficiency.

The picture may also be encoded on a "slice" basis. In one example, a slice is a horizontally adjacent group of CUs. But in more general terms, the entire residual image could form a slice, or a slice could be a single CU, or a slice could be a row of CUs, and so on. Slices can give some resilience to errors as they are encoded as independent units. The encoder and decoder states are completely reset at a slice boundary.

For example, intra-prediction is not carried out across slice boundaries; slice boundaries are treated as image boundaries for this purpose.

Figure 10:
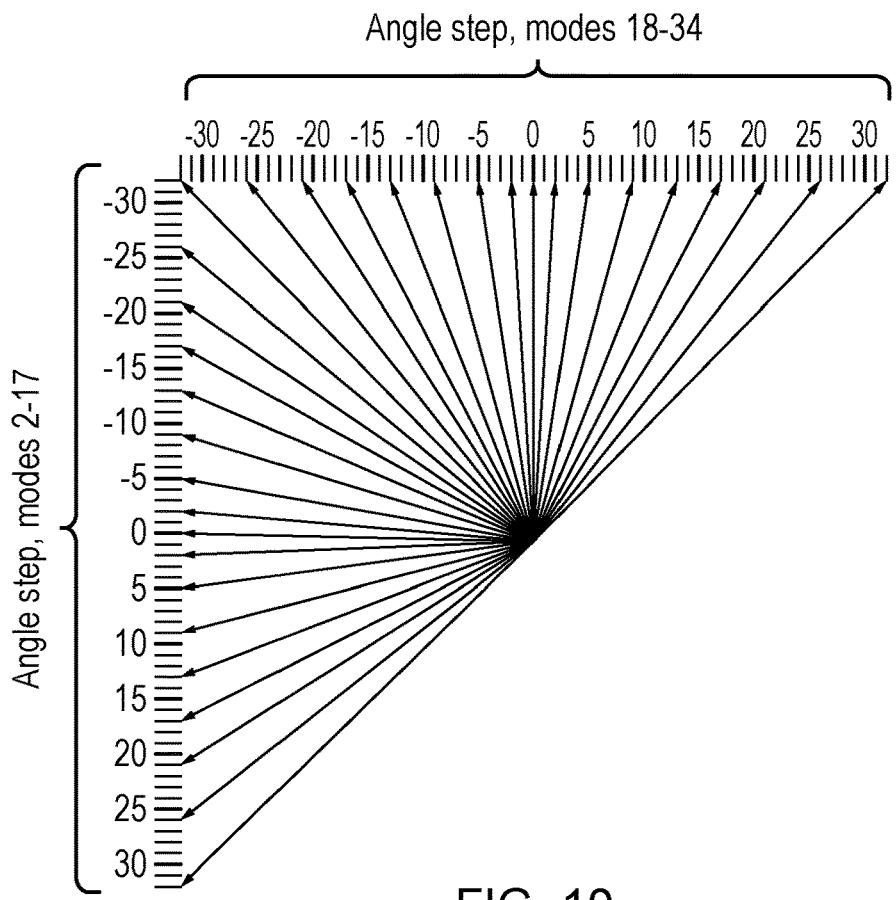
FIG. 10 schematically illustrates a set of possible intra-prediction directions.
Figure 11:
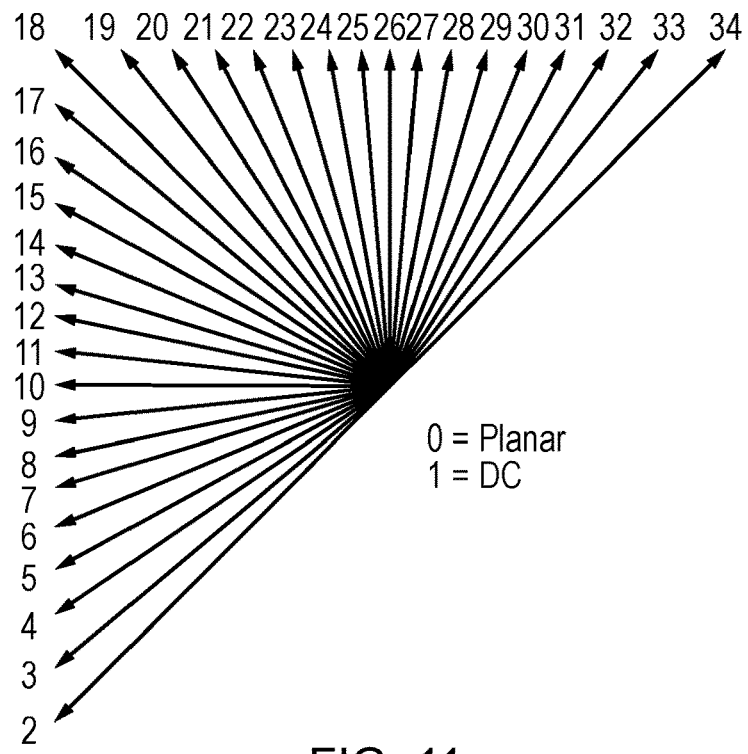
FIG. 11 schematically illustrates a set of prediction modes.

FIG. 10 schematically illustrates a set of possible (candidate) prediction directions. The full set of candidate directions is available to a prediction unit. The directions are determined by horizontal and vertical displacement relative to a current block position, but are encoded as prediction "modes", a set of which is shown in FIG. 11. Note that the so-called DC mode represents a simple arithmetic mean of the surrounding upper and left-hand samples. Note also that the set of directions shown in FIG. 10 is just one example; in other examples, a set of (for example) 65 angular modes plus DC and planar (a full set of 67 modes) as shown schematically in FIG. 12 makes up the full set. Other numbers of modes could be used.

In general terms, after detecting a prediction direction, the systems are operable to generate a predicted block of samples according to other samples defined by the prediction direction. In examples, the image encoder is configured to encode data identifying the prediction direction selected for each sample or region of the image (and the image decoder is configured to detect such data).

Figure 13:
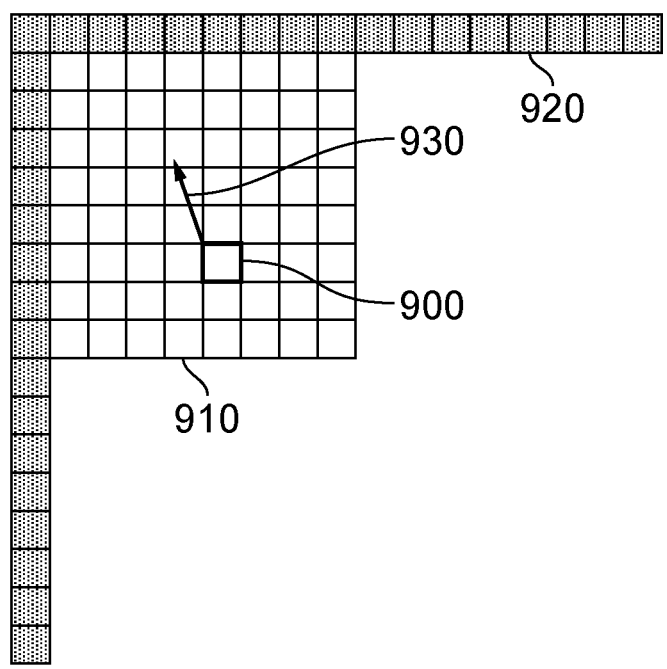
FIG. 13 schematically illustrates an intra-prediction process.

FIG. 13 schematically illustrates an intra-prediction process in which a sample 900 of a block or region 910 of samples is derived from other reference samples 920 of the same image according to a direction 930 defined by the intra-prediction mode associated with that sample. The reference samples 920 in this example come from blocks above and to the left of the block 910 in question and the predicted value of the sample 900 is obtained by tracking along the direction 930 to the reference samples 920. The direction 930 might point to a single individual reference sample but in a more general case an interpolated value between surrounding reference samples is used as the prediction value. Note that the block 910 could be square as shown in FIG. 13 or could be another shape such as rectangular.

Figure 14:
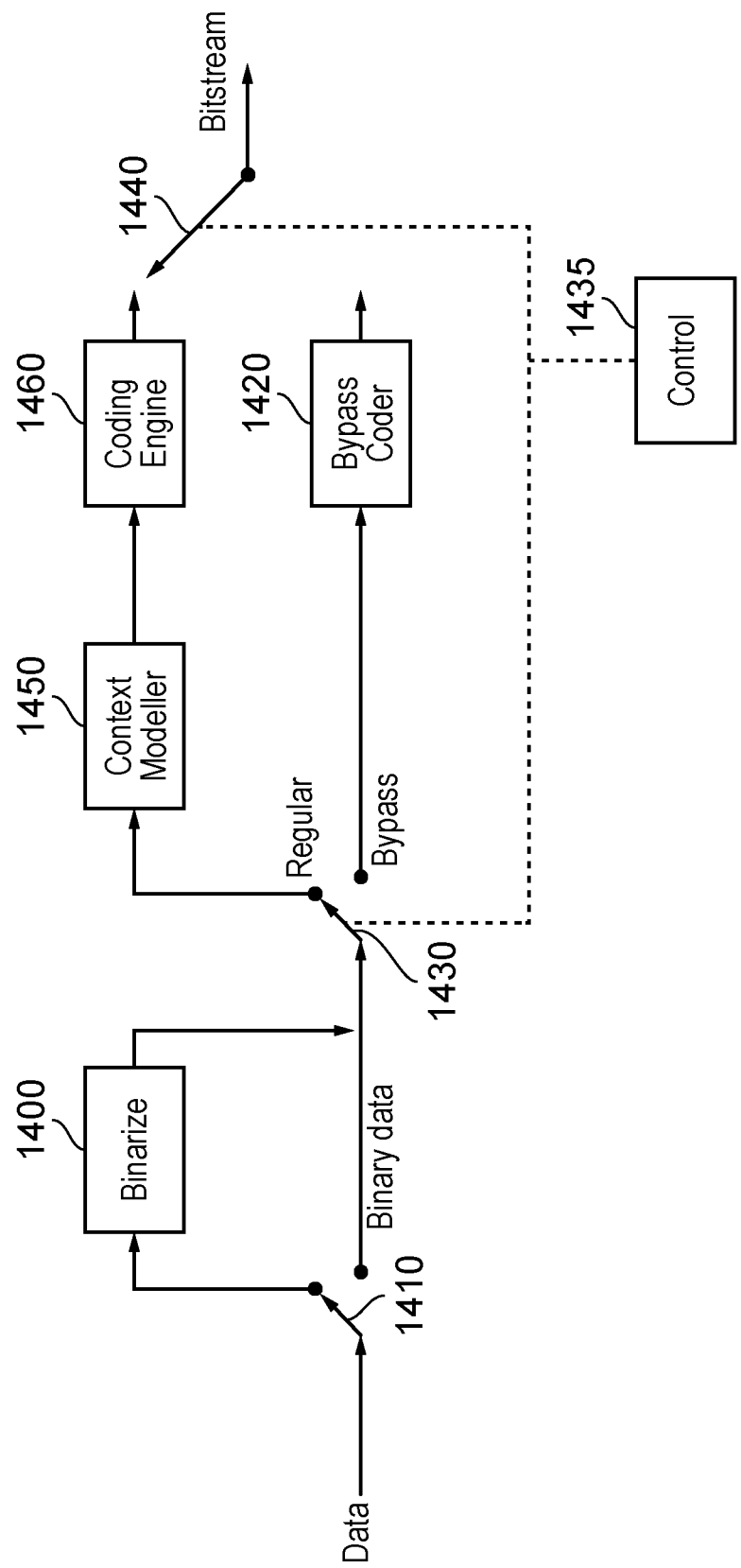
FIG. 14 schematically illustrates a CABAC encoder.
Figure 15:
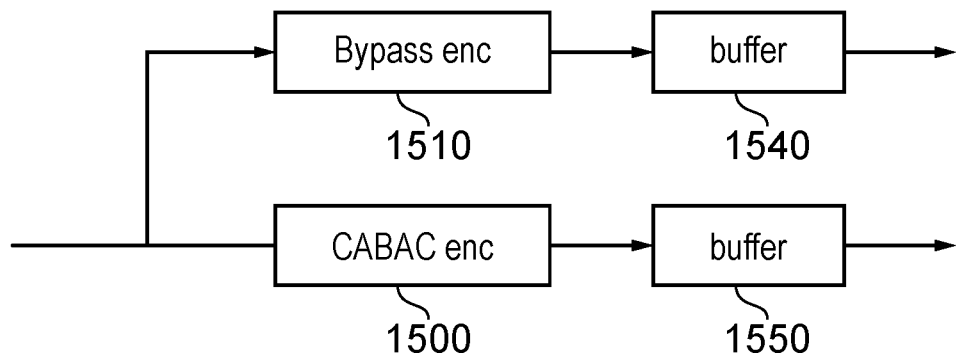
FIGS. 15 and 16 schematically illustrate CABAC encoding techniques.

FIGS. 14 and 15 schematically illustrate a previously proposed reference sample projection process.

In FIGS. 14 and 15, a block or region 1400 of samples to be predicted is surrounded by linear arrays of reference samples from which the intra prediction of the predicted samples takes place. The reference samples 1410 are shown as shaded blocks in FIGS. 14 and 15, and the samples to be predicted are shown as unshaded blocks. Note that an 8×8 block or region of samples to be predicted is used in this example, but the techniques are applicable to variable block sizes and indeed block shapes.

As mentioned, the reference samples comprise at least two linear arrays in respective orientations with respect to the current image region of samples to be predicted. For example, the linear arrays may be an array or row 1420 of samples above the block of samples to be predicted and an array or column 1430 of samples to the left of the block of samples to be predicted.

Figure 12:
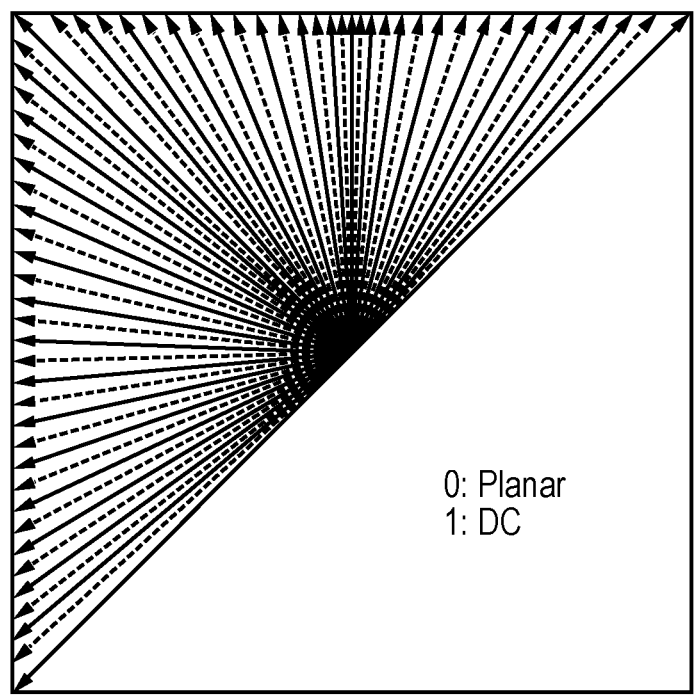
FIG. 12 schematically illustrates another set of prediction modes.

As discussed above with reference to FIG. 13, the reference sample arrays can extend beyond the extent of the block to be predicted, in order to provide for prediction modes or directions within the range indicated in FIGS. 10-12. Where necessary, if previously decoded samples are not available for use as reference samples at particular reference sample positions, other reference samples can be re-used at those missing positions. Reference sample filtering processes can be used on the reference samples.

FIG. 14 schematically illustrates the operation of a CABAC entropy encoder.

The CABAC encoder operates in respect of binary data, that is to say, data represented by only the two symbols 0 and 1. The encoder makes use of a so-called context modelling process which selects a "context" or probability model for subsequent data on the basis of previously encoded data. The selection of the context is carried out in a deterministic way so that the same determination, on the basis of previously decoded data, can be performed at the decoder without the need for further data (specifying the context) to be added to the encoded data stream passed to the decoder.

Referring to FIG. 14, input data to be encoded may be passed to a binary converter 1400 if it is not already in a binary form; if the data is already in binary form, the converter 1400 is bypassed (by a schematic switch 1410). In the present embodiments, conversion to a binary form is actually carried out by expressing the quantised DCT coefficient data as a series of binary "maps", which will be described further below.

The binary data may then be handled by one of two processing paths, a "regular" and a "bypass" path (which are shown schematically as separate paths but which, in embodiments of the invention discussed below, could in fact be implemented by the same processing stages, just using slightly different parameters). The bypass path employs a so-called bypass coder 1420 which does not necessarily make use of context modelling in the same form as the regular path. In some examples of CABAC coding, this bypass path can be selected if there is a need for particularly rapid processing of a batch of data, but in the present embodiments two features of so-called "bypass" data are noted: firstly, the bypass data is handled by the CABAC encoder (950, 1460), just using a fixed context model representing a 50% probability; and secondly, the bypass data relates to certain categories of data, one particular example being coefficient sign data. Otherwise, the regular path is selected by schematic switches 1430, 1440 operating under the control of control circuitry 1435. This involves the data being processed by a context modeller 1450 followed by a coding engine 1460.

The entropy encoder shown in FIG. 14 encodes a block of data (that is, for example, data corresponding to a block of coefficients relating to a block of the residual image) as a single value if the block is formed entirely of zero-valued data. For each block that does not fall into this category, that is to say a block that contains at least some non-zero data, a "significance map" is prepared. The significance map indicates whether, for each position in a block of data to be encoded, the corresponding coefficient in the block is non-zero. The significance map data, being in binary form, is itself CABAC encoded. The use of the significance map assists with compression because no data needs to be encoded for a coefficient with a magnitude that the significance map indicates to be zero. Also, the significance map can include a special code to indicate the final non-zero coefficient in the block, so that all of the final high frequency/trailing zero coefficients can be omitted from the encoding. The significance map is followed, in the encoded bit stream, by data defining the values of the non-zero coefficients specified by the significance map.

Further levels of map data are also prepared and are encoded. An example is a map which defines, as a binary value (1=yes, 0=no) whether the coefficient data at a map position which the significance map has indicated to be "non-zero" actually has the value of "one". Another map specifies whether the coefficient data at a map position which the significance map has indicated to be "non-zero" actually has the value of "two". A further map indicates, for those map positions where the significance map has indicated that the coefficient data is "non-zero", whether the data has a value of "greater than two". Another map indicates, again for data identified as "non-zero", the sign of the data value (using a predetermined binary notation such as 1 for +, 0 for −, or of course the other way around).

In embodiments of the invention, the significance maps and the other maps are allocated in a predetermined manner either to the CABAC encoder or to the bypass encoder, and are all representative of different respective attributes or value ranges of the same initial data items. In one example, at least the significance map is CABAC encoded and at least some of the remaining maps (such as the sign data) are bypass encoded. Accordingly, each data item is split into respective subsets of data and the respective subsets are encoded by first (for example, CABAC) and second (for example, bypass) encoding systems. The nature of the data and of the CABAC and bypass encoding is such that for a predetermined quantity of CABAC encoded data, a variable quantity of zero or more bypass data is generated in respect of the same initial data items. So, for example, if the quantised, reordered DCT data contains substantially all zero values, then it may be that no bypass data or a very small quantity of bypass data is generated, because the bypass data concerns only those map positions for which the significance map has indicated that the value is non-zero. In another example, in quantised reordered DCT data having many high value coefficients, a significant quantity of bypass data might be generated.

In embodiments of the invention, the significance map and other maps are generated from the quantised DCT coefficients, for example by the scan unit 360, and is subjected to a zigzag scanning process (or a scanning process selected from zigzag, horizontal raster and vertical raster scanning according to the intra-prediction mode) before being subjected to CABAC encoding.

In general terms, CABAC encoding involves predicting a context, or a probability model, for a next bit to be encoded, based upon other previously encoded data. If the next bit is the same as the bit identified as "most likely" by the probability model, then the encoding of the information that "the next bit agrees with the probability model" can be encoded with great efficiency. It is less efficient to encode that "the next bit does not agree with the probability model", so the derivation of the context data is important to good operation of the encoder. The term "adaptive" means that the context or probability models are adapted, or varied during encoding, in an attempt to provide a good match to the (as yet uncoded) next data.

Using a simple analogy, in the written English language, the letter "U" is relatively uncommon. But in a letter position immediately after the letter "Q", it is very common indeed. So, a probability model might set the probability of a "U" as a very low value, but if the current letter is a "Q", the probability model for a "U" as the next letter could be set to a very high probability value.

CABAC encoding is used, in the present arrangements, for at least the significance map and the maps indicating whether the non-zero values are one or two. Bypass processing—which in these embodiments is identical to CABAC encoding but for the fact that the probability model is fixed at an equal (0.5:0.5) probability distribution of 1 s and 0 s, is used for at least the sign data and the map indicating whether a value is >2. For those data positions identified as >2, a separate so-called escape data encoding can be used to encode the actual value of the data. This may include a Golomb-Rice encoding technique.

The CABAC context modelling and encoding process is described in more detail in WD4: Working Draft 4 of High-Efficiency Video Coding, JCTVC-F803_d5, Draft ISO/IEC 23008-HEVC; 201x(E) 2011 Oct. 28.

Figure 16:
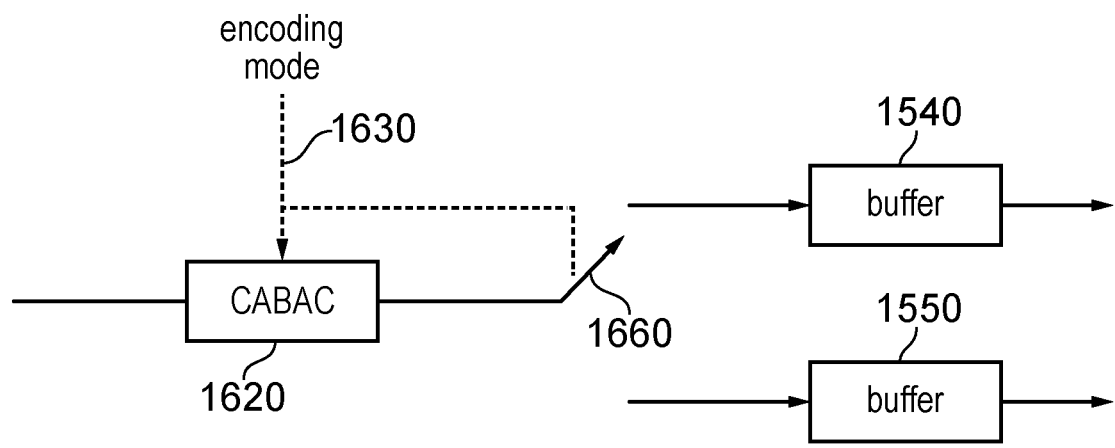

Referring now to FIGS. 15 and 16, an entropy encoder forming part of a video encoding apparatus comprises a first encoding system (for example an arithmetic coding encoding system such as a CABAC encoder 1500) and a second encoding system (such as a bypass encoder 1510), arranged so that a particular data word or value is encoded to the final output data stream by either the CABAC encoder or the bypass encoder but not both. In embodiments of the invention, the data values passed to the CABAC encoder and to the bypass encoder are respective subsets of ordered data values split or derived from the initial input data (the reordered quantised DCT data in this example), representing different ones of the set of "maps" generated from the input data.

The schematic representation in FIG. 15 treats the CABAC encoder and the bypass encoder as separate arrangements. This may well be the case in practice, but in another possibility, shown schematically in FIG. 16, a single CABAC encoder 1620 is used as both the CABAC encoder 1500 and the bypass encoder 1510 of FIG. 15. The encoder 1620 operates under the control of an encoding mode selection signal 1630, so as to operate with an adaptive context model (as described above) when in the mode of the CABAC encoder 1500, and to operate with a fixed 50% probability context model when in the mode of the bypass encoder 1510.

A third possibility combines these two, in that two substantially identical CABAC encoders can be operated in parallel (similar to the parallel arrangement of FIG. 15) with the difference being that the CABAC encoder operating as the bypass encoder 1510 has its context model fixed at a 50% probability context model.

The outputs of the CABAC encoding process and the bypass encoding process can be stored (temporarily at least) in respective buffers 1540, 1550. In the case of FIG. 16, a switch or demultiplexer 1660 acts under the control of the mode signal 1630 to route CABAC encoded data to the buffer 1550 and bypass encoded data to the buffer 1540.

Figure 17:
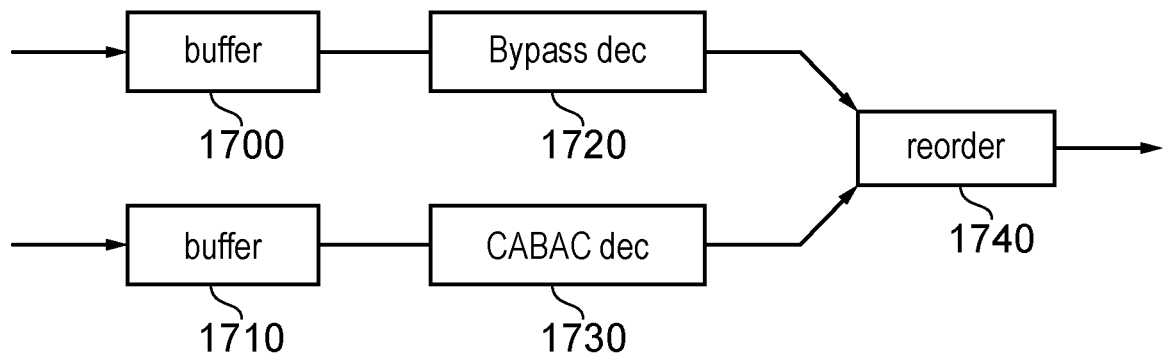
FIGS. 17 and 18 schematically illustrate CABAC decoding techniques.
Figure 18:
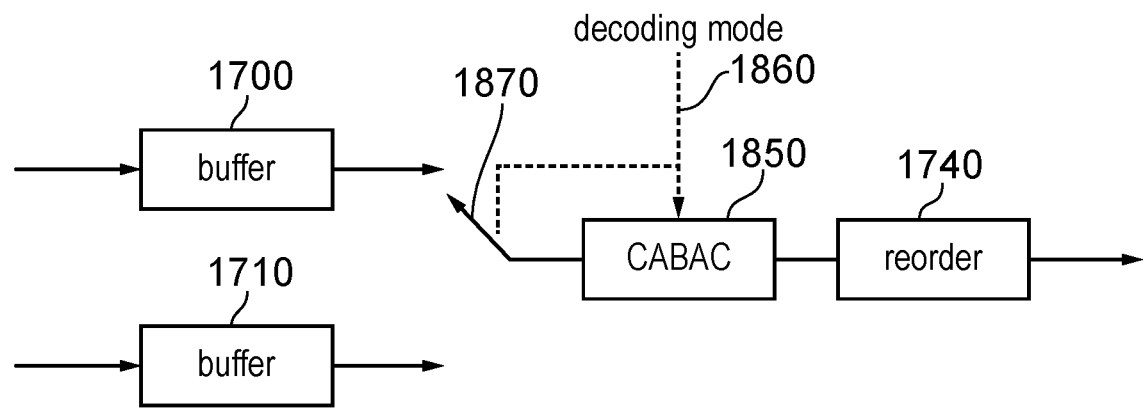

FIGS. 17 and 18 schematically illustrate examples of an entropy decoder forming part of a video decoding apparatus. Referring to FIG. 17, respective buffers 1710, 1700 pass data to a CABAC decoder 1730 and a bypass decoder 1720, arranged so that a particular encoded data word or value is decoded by either the CABAC decoder or the bypass decoder but not both. The decoded data are reordered by logic 1740 into the appropriate order for subsequent decoding stages.

The schematic representation in FIG. 17 treats the CABAC decoder and the bypass decoder as separate arrangements. This may well be the case in practice, but in another possibility, shown schematically in FIG. 18, a single CABAC decoder 1850 is used as both the CABAC decoder 1730 and the bypass decoder 1720 of FIG. 17. The decoder 1850 operates under the control of a decoding mode selection signal 1860, so as to operate with an adaptive context model (as described above) when in the mode of the CABAC decoder 1730, and to operate with a fixed 50% probability context model when in the mode of the bypass encoder 1720.

As before, a third possibility combines these two, in that two substantially identical CABAC decoders can be operated in parallel (similar to the parallel arrangement of FIG. 17) with the difference being that the CABAC decoder operating as the bypass decoder 1720 has its context model fixed at a 50% probability context model.

In the case of FIG. 18, a switch or multiplexer 1870 acts under the control of the mode signal 1860 to route CABAC encoded data to the decoder 1850 from the buffer 1700 or the buffer 1710 as appropriate.

Figure 19:
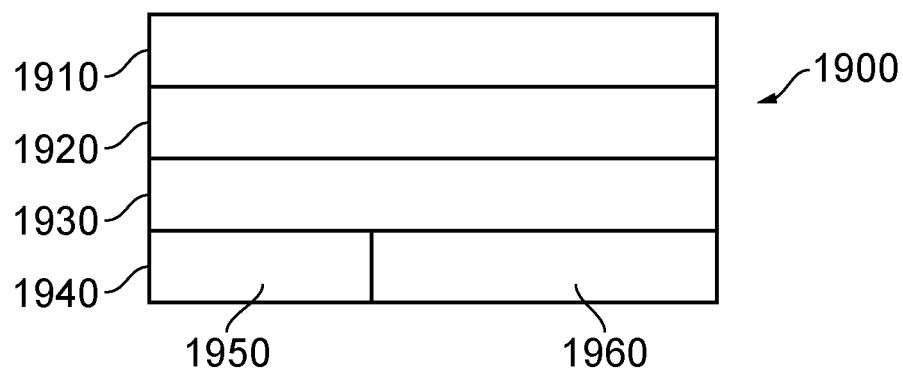
FIG. 19 schematically illustrates a partitioned image.

FIG. 19 schematically illustrates a picture 1900 and will be used to demonstrate various picture partitioning schemes relevant to the following discussion.

One example of the partitioning of a picture is into slices or "regular slices". Each regular slice is encapsulated in its own network abstraction layer (NAL) unit. Prediction within the picture (for example intrasample prediction, motion information prediction, coding mode prediction) and entropy coding dependency across slice boundaries are disallowed. This means that a regular slice can be reconstructed independently from other regular slices within the same picture.

A so-called tile defines a horizontal and a vertical boundary to partition a picture into rows and columns of tiles. In a corresponding way to regular slices, in-picture prediction dependencies are not allowed across tile boundaries, nor are entropy decoding dependencies. However, tiles are not constrained to be included into individual NAL units.

In general terms, there may be multiple tiles within a slice, or multiple slices within a tile, and one or more of each within a picture. The schematic example of FIG. 19 shows 4 slices 1910, 1920, 1930, 1940, with the slice 1940 comprising 2 tiles 1950, 1960. However, as mentioned, this is simply an arbitrary schematic example.

In some example arrangements, a threshold exists for the number of bins (either EP or CABAC) that may be encoded in a slice or a picture, according to the following equation:

$$\text{BinCountsinNalUnits} <= (4/3)*\text{NumBitsInVclNalUnits} + (\text{RawMinCuBits}*\text{PicSizeInMinCbsY})/32 \quad \text{(eq. 1)}$$

The right hand side of the equation is dependent on the sum of two parts: these are a constant value (RawMinCuBits*PicSizeInMinCbsY) for a particular image region and related to the size of the slice or picture and a dynamic value (NumBitsInVclNalUnits) which is the number of bits coded in the output stream of the slice or picture. Note that the value 4/3 represents a number of bins per bit.

RawMinCuBits is the number of bits in a raw CU of minimum size—typically 4*4; and PicSizeInMinCbsY is the number of minimum size CUs in the slice or picture.

If this threshold is exceeded, CABAC zero words (3 bytes with values 00 00 03) are appended to the stream, until the threshold is achieved. Each such zero word increments the dynamic value by 3.

This constraint may be expressed as:

$$N <= K1*B + (K2*CU)$$

in which:
N=number of binarized symbols in the output data unit;
K1 is a constant;
B=number of encoded bytes for the output data unit;
K2 is a variable dependent upon properties of minimum size coding units employed by the image data encoding apparatus; and
CU=size of the picture, slice or tile represented by the output data unit expressed as a number of coding units of minimum size.

In previously proposed examples, this threshold check is performed at the picture and slice level.

As an alternative, the following expression of the same threshold may be used, where the difference is in the reference to bytes instead of bits:

$$\text{BinCountsinNalUnits} <= (32/3)*\text{NumBytesInVclNalUnits} + (\text{RawMinCuBits}*\text{PicSizeInMinCbsY})/32 \quad \text{(eq. 2)}$$

The threshold in eq. 1 (or as equivalently expressed in eq. 2) may be applied uniformly, that is to say irrespective of other encoding or decoding parameters, attributes or the like.

An example of the technical justification for using such a threshold may be that the threshold itself indirectly defines a maximum level of processing performance which is required by a real-time decoder. Real-time decoding relies on decoding each frame in time to achieve a particular output frame rate (for example, a number of frames per second). The constraint on the processing performance of the real-time decoder in turn depends upon the rate at which bins need to be decoded, rather than the amount of resulting decoded data. In order to allow for a relatively straightforward rate control at the encoder side, a technique used to control this situation is to limit (as, for example, an upper limit or threshold or constraint) the number of bins per slice or picture. The maximum processing performance required by the CABAC decoder may then be considered as a product or function of this limit and the rate at which slices or pictures must be decoded.

It is therefore important to aim to set the threshold (or upper limit or constraint) appropriately. A threshold which is too high can lead to problems of either implementing or successfully operating a real-time decoder. Similarly, use of an incorrect or inappropriate threshold can lead to excessive use of padding data (for example dummy or other data simply aiming to occupy portions of the encoded data stream, for example to increase the size of an encoded output data unit), reducing the efficiency of encoding.

As noted with reference to FIG. 19, a picture or slice can be split into a number of tiles. An example of why this might be performed is to allow the use of multiple concurrent (parallel) decoders.

Under the previously proposed arrangement, each tile does not necessarily meet the threshold calculation discussed above. This could cause problems if, for example, a tile is used or decoded independently as though a picture, or if different tiles (for example with different quantisation parameters or from different sources) are composited together, there can be no guarantee that the resulting composited slice or picture complies with the specification set out above.

To address this issue, in example embodiments, the CABAC threshold is applied at the end of each tile rather than at the end of each slice or picture alone. So, the application of the threshold occurs at the end of encoding any one of a tile, a slice and a picture. Having said this, if each tile in an image is compliant with the threshold, it can be assumed that the whole picture must also be compliant, so that in the case of a picture divided into slices or tiles, it is not therefore necessary to apply the threshold again at the end of encoding the picture.

The terms "tile" and "slice" refer to independently decodable units and represent names in use at the priority date of the present application. In the case of a subsequent or other change of name, the arrangement is applicable to other such independently decodable units.

Therefore, in example arrangements, the data unit may be an independently decodable data unit. For example the image portion (represented by an output data unit) may be one of a picture, slice or tile.

In order to apply the equation discussed above, the dynamic value represents the number of bytes coded in the output stream of the tile and the fixed value is dependent upon the number of minimum size coding units (CUs) in the tile.

Figure 20:
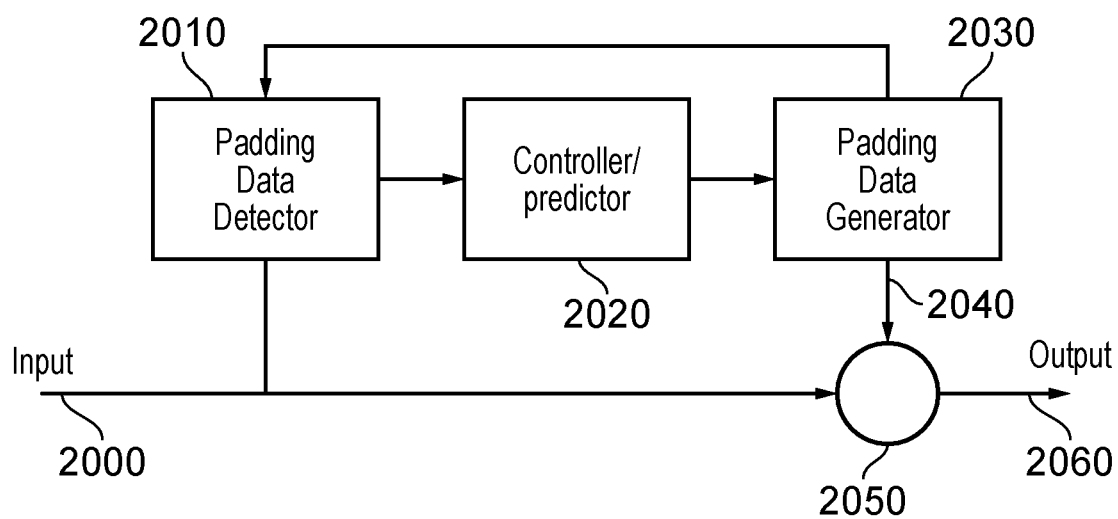
FIG. 20 schematically illustrates an apparatus.

FIG. 20 schematically illustrates apparatus configured to perform this test. Referring to FIG. 20, at an input 2000 a CABAC/EP encoded stream is received from an encoder. A padding data detector 2010 detects, at a predetermined stage with reference to the completion of a slice or tile, such as at the end of encoding a slice or tile, whether the threshold calculation described above is complied with. A controller 2020 controls a padding data generator 2030 in response to the detection by the detector 2010 to generate padding data 2040 such as the CABAC zero words described above and to append this by a combiner 2050 to the stream to form an output stream 2060. The generation of zero words can also be signalled back to the detector 2010 so that as the zero words are appended, the padding data detector 2010 can continue to monitor for compliance with the threshold and cause the controller 2020 to cease the generation of zero words once the threshold has been complied with.

In other examples, the controller 2020 may also act as a predictor configured to generate a prediction, during generation of the output data unit, of whether the constraint will be met by that output data unit in connection with embodiments to be described here.

The predetermined stage could be, for example, every n encoded bins (where n is an integer of one or more), but in example arrangements the predetermined stage is the end of encoding the current output data unit.

In FIG. 20, therefore, there is disclosed an example of a padding data detector 2010 configured to detect, at a predetermined stage relative to the encoding of a current output data unit, whether the constraint will be met by the current output data unit; and a padding data generator 2030 configured to generate and insert in the current output data unit sufficient padding data so that the output data unit including the inserted padding data meets the constraint.

Figure 21:
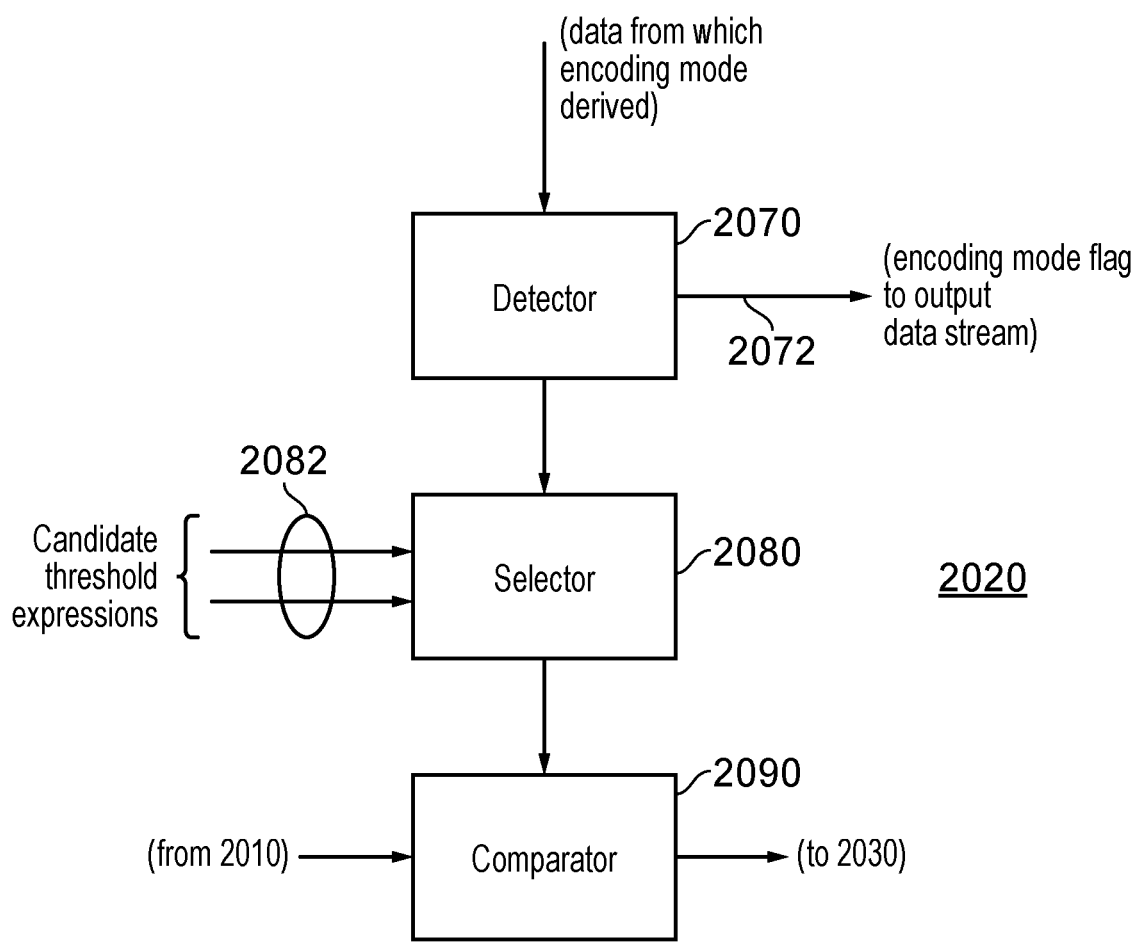
FIG. 21 schematically illustrates a controller.

Referring to FIG. 21, in some examples the controller 2020 comprises an attribute detector 2070 configured to detect an encoding attribute applicable to a given output data unit; and
 a selector 2080 configured to select, in response to the detected encoding attribute, a constraint, for use with the given output data unit, from two or more candidate constraints 2082.

The controller 2020 may also comprise a comparator 2090 to compare a threshold derived from a currently selected constraint with the detection by the padding data detector 2010 in order to derive a control signal to control the operation of the padding data generator 2030.

The attribute detected by the detector 2070 may be, for example, an encoding attribute (such as an encoding mode or profile, for example the enabling of dependent quantisation (to be discussed below) which is a mode of operation in which a selection of a quantisation parameter for use in quantising a current data value depends at least in part on a property of a previously encoded data value and which is then represented by flag data (shown schematically as 2072) included in or associated with the encoded data stream so that it is later detectable at the decoder. For example, the flag data may be included in header data such as output data unit header data (for example, slice header data). The detector 2070 does not itself need to generate or insert the flag data; this aspect of the process is shown in FIG. 21 merely for schematic purposes for the benefit of the present description. The attribute may be considered as being applicable to a given output data unit, even if (as in some examples) the attribute is also applicable to other (for example preceding or subsequent) output data units.

Therefore the apparatus of FIGS. 7 and 14, operating in accordance with the techniques discussed with respect to FIGS. 19 and 20 (and those discussed below) provides an example of image data encoding apparatus, comprising:
 a first data encoder 1450, 1460 and a second data encoder 1420, each configured to generate output data bits representing binarized symbols from successive symbols representing image data;
 the first data encoder being configured to generate output data bits representing encoded symbols at a variable ratio of a number of data bits to a number of encoded symbols;
 the second data encoder being configured to generate a fixed number of output data bits to represent each encoded symbol;
 the entropy encoder being configured (for example, using the controller 2020 and/or the controller 1435) to generate an output data stream subject to a constraint defining an upper limit to the number of binarized symbols that may be expressed by any individual output data unit relative to the size in bytes of that output data unit, in which the entropy encoder is configured to provide padding data, for each output data unit which does not meet the constraint, so as to increase the size in bytes of that output data unit in order to meet the constraint; the apparatus comprising:
 an attribute detector 2070 configured to detect an encoding attribute applicable to a given output data unit; and
 a selector 2080 configured to select, in response to the detected encoding attribute, a constraint, for use with the given output data unit, from two or more candidate constraints.

Using techniques shown in FIG. 14, The first data encoder/decoder may be a context adaptive binary arithmetic coding (CABAC) encoder/decoder. The second data encoder/decoder may be a bypass encoder/decoder. The second data encoder/decoder may be a binary arithmetic coder/decoder using a fixed 50% probability context model.

An example of the application of the threshold or constraint is as follows.

In general terms, the test is "does the amount of output data generated meet the threshold test?" This can be performed for example at the end of encoding an output data unit.

The apparatus of FIG. 7, operating in accordance with the techniques discussed here, provides an example of image data encoding apparatus, comprising:
 an entropy encoder configured to selectively encode data items representing image data so as to generate encoded binarized symbols of successive output data units;
 the entropy encoder being configured to generate an output data stream subject to a constraint defining an upper limit to the number of binarized symbols that may be expressed by any individual output data unit relative to the size in bytes of that output data unit, in which the entropy encoder is configured to provide padding data, for each output data unit which does not meet the constraint, so as to increase the size in bytes of that output data unit in order to meet the constraint; the apparatus comprising:

an attribute detector configured to detect an encoding attribute applicable to a given output data unit; and a selector configured to select, in response to the detected encoding attribute, a constraint, for use with the given output data unit, from two or more candidate constraints.

The present disclosure also provides a suitable decoding apparatus to decode a data signal generated by the method or apparatus described here.

Further examples of the constraint will now be described.

In the examples discussed above, a single threshold derivation or expression is used consistently. In alternative examples to be described below, a choice is implemented between two or more candidate thresholds or constraints. The choice or selection may be in response to one or more encoding attributes (for example, parameters, attributes or modes, for example parameters or modes which are signalled by flags or the like from the encoder side to the decoder side, or parameters, attributes or modes which are derivable in a corresponding or matching way at the encoder and decoder sides).

An example of a further candidate expression for the threshold or constraint is as follows:

$$BinCountsInNalUnits <= 10*NumBytesInVclNalUnits + (RawMinCuBits*PicSizeInMinCbsY)/16 \quad (eq. 3)$$

So, although this eq. 3 could be used uniformly as discussed earlier, in example embodiments a selection is implemented between two or more candidate expressions, for example between eq. 1/2 (as equivalent expressions of the same thing) and eq. 3.

In some examples, the selection may be made in dependence upon whether a given coding attribute signalled in or with the encoded data stream is in a first or a second state, with a respective state of the given attribute corresponding to a selection, at the encoder side and the decoder side, of a respective candidate expression (for example, eq. 1/2 or eq. 3).

An example of such an attribute is the so-called "dep_quant_enabled_flag". This indicates in a slice header whether or not a technique referred to as dependent quantisation is enabled in respect of the slice to which that slice header applies.

An alternative to the use of the dep_quant_enabled_flag is in fact a dependence on the availability of the (dep_quant) tool, rather than whether the tool is enabled. So for an example profile, the profile might itself define (for example) "dep_quant_enabled_flag must be off (not enabled)"; in another there may be no such constraint, allowing the dep_quant tool to be on (enabled) or off (not enabled). The selection could therefore be made at the profile constraint, rather than on whether the dep_quant tool is currently enabled or disabled.

Dependent quantisation is defined in "Versatile Video Coding (Draft 5), Bross et al, JVET-N1001-v10, July 2019 (which is incorporated into the present description by reference); see for example section 8.7.3. It relates to a technique by which the decoding process selects between multiple possible quantisation parameters or sets of quantisation parameters, for example in response to a property (such as for example a parity property) of previously encoded and decoded sample values. So, when dep_quant_enabled_flag=1 (enabled), such an ongoing dependent quantisation selection takes place. When dep_quant_enabled_flag=0 (disabled), such an ongoing dependent quantisation selection does not take place. As mentioned above, the flag dep_quant_enabled_flag is provided (as an example of a coding attribute) for example in a slice header so that the enabling or disabling of dependent quantisation applies to whole slice.

A different constraint can be relevant when dependent quantisation is in use or is at least possible because of the empirical observation that dependent quantisation, when applied, can alter an expected relationship between encoded bins and decoded bins. A different constraint, such as eq. 3, can be more appropriate for use with dependent quantisation.

Where multiple candidate constraints are applicable, a decoder would be expected to be subject to a design constraint to provide sufficient processing power, speed or capacity to cope with encoded data generated under the more challenging (or most challenging) of the different available constraints.

More generally, however, any such attribute (for example a flag or parameter) could be used, whether or not it is explicitly signalled in or with the data stream. For example, different candidate expressions could be selected in respect of different respective instances of so-called "profiles", where a profile in this context defines a set or basket of parameters such as bit depth, chrominance sampling (for example, 4:0:0 (monochrome), 4:2:0, 4:2:2, 4:4:4 or the like), restrictions on encoding type (such as intra-picture encoding only) and so on.

In example embodiments, an attribute defining some aspect of an output data unit can be used conveniently, because then the relevant threshold derivation can be applied to that output data unit. Examples of output data units in this context can include output data units representing respective image portions such as slices, tiles or pictures. Other examples of suitable attributes can include: for a slice: whether slice type is intra only, or unrestricted (could include inter). As a tile example consider the case of composition of a picture from multiple sources (one tile per source). Each tile could have its own threshold derivation dependent on how it was originally encoded. Alternatively, the attribute could be determined using the value of the attribute for the previous tile/output data unit at the same position in the picture.

In some examples, as discussed above, the constraint or threshold is defined by an expression such as:

$$N <= K1*B + (K2*CU)$$

in which:

N=number of binarized symbols in the output data unit;

K1 is a constant;

B=number of encoded bytes for the output data unit;

K2 is a variable dependent upon properties of minimum size coding units employed by the image data encoding apparatus; and CU=size of the picture, slice or tile represented by the output data unit expressed as a number of coding units of minimum size.

It will be noted that this is in fact a generalisation of eq.1, eq. 2 and eq. 3 discussed above. An example list of candidate constraints referring to K1 and K2 is as follows:

|  | K1 | K2 |
|---|---|---|
| Eq. 1 or expressed as | 4/3 | RawMinCuBits*PicSizeInMinCbsY/32 |
| Eq. 2 | 32/3 | RawMinCuBits*PicSizeInMinCbsY/32 |
| Eq. 3 | 10 | RawMinCuBits*PicSizeInMinCbsY/16 |
| Eq. 4 | 32/3 | (3/64) * RawMinCuBits*PicSizeInMinCbsY |
| Eq. 5 | vclByteScaleFactor | RawMinCuBits*PicSizeInMinCbsY/32 |
| Eq. 6 | 36/3 | RawMinCuBits*PicSizeInMinCbsY/32 |
| Eq. 7 | 3/2 | RawMinCuBits*PicSizeInMinCbsY/32 |

With regard to the example of Eq. 5, the variable vclByteScaleFactor can be expressed as:

$$vclByteScaleFactor=(32+4*general\_tier\_flag)/3$$

where general_tier_flag is an indicator of an encoding tier and varies (in at least some examples) as flag values of either 0 or 1, with 0 indicating a so-called main tier and 1 indicating a so-called high tier. For a particular encoding level (representing maximum dimensions of the images to be encoded), the high tier generally corresponds to a higher bit rate representation than the main tier. In this example therefore, the image data encoding apparatus is configured to operate at an encoding tier selected from at least two candidate encoding tiers and to generate a tier parameter (for example, to be encoded within or at least in association with the encoded image data or bitstream) defining the currently selected encoding tier, in which at least the constant K1 is dependent upon the tier parameter. For example, a higher tier parameter may indicate a higher quality encoded output for a given image size, and the parameter K1 may increase with the tier parameter.

This allows the processing, circuitry, code or logic used to generate the threshold value to be conveniently identical or substantially identical in each case, with the parameters K1 and K2 simply being altered in respect of each of the example equations eq.1/2-eq. 7. However, it will be appreciated that one or more different equations or expressions (or even potentially different fixed threshold values) could be used, as between the different candidate thresholds or constraints discussed above.

The candidate constraints 2082 can therefore be stored or expressed as pairs of (K1, K2) to be selected by the selector 2080. The pairs of (K1, K2) can be predetermined and stored and the encoder and decoder, or the pairs (or an indication of a subset of a larger set of predetermined pairs) could be transmitted from the encoder to the decoder as (for example) part of profile or parameter set data. The expression $N<=K1*B+(K2*CU)$ can then be tested at the comparator 2090 using the prevailing selected (K1, K2).

Figure 22A:
FIGS. 22A and 22B schematically represent output data units.
Figure 22B:
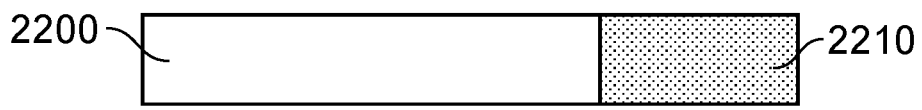

FIGS. 22A and 22B provide two schematic examples of output data units, extending across the page, and including binarized data 2200 and padding data 2210 as provided and inserted by the techniques described above. The amount of padding data can depend upon the particular image data being encoded (in terms of how efficiently it is able to be encoded) and the constraint in use.

Figure 23:
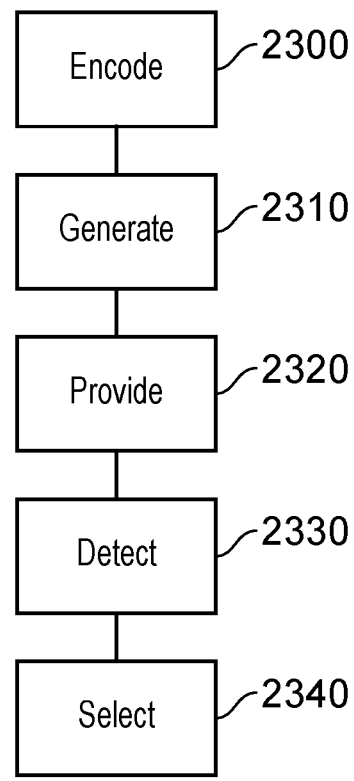
FIG. 23 is a schematic flowchart illustrating a method.

FIG. 23 is a schematic flowchart illustrating an image data encoding method, comprising:
  selectively encoding (at a step 2300) data items representing image data so as to generate encoded binarized symbols of successive output data units;
  generating (at a step 2310) an output data stream subject to a constraint defining an upper limit to the number of binarized symbols that may be expressed by any individual output data unit relative to the size in bytes of that output data unit;
  providing (at a step 2320) padding data, for each output data unit which does not meet the constraint, so as to increase the size in bytes of that output data unit in order to meet the constraint;
  detecting (at a step 2330) an encoding attribute applicable to a given output data unit; and
  selecting (at a step 2340), in response to the detected encoding attribute, a constraint, for use with the given output data unit, from two or more candidate constraints.

Example embodiments also provide an image decoder comprising circuitry configured to interpret an encoded signal having been generated by controlling the image data encoding apparatus of any one or more of the embodiments described here and to output decoded video images.

Example embodiments also provide an image decoder comprising circuitry configured to interpret an encoded signal having been generated by controlling the first and second data encoders and the controller of any one or more of the embodiments described here and to output decoded video images.

Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors. Similarly, a data signal comprising coded data generated according to the methods discussed above (whether or not embodied on a non-transitory machine-readable medium) is also considered to represent an embodiment of the present disclosure.

It will be apparent that numerous modifications and variations of the present disclosure are possible in light of the above teachings. It is therefore to be understood that within the scope of the appended clauses, the technology may be practised otherwise than as specifically described herein.

Respective aspects and features are defined by the following numbered clauses:
  1. Image data encoding apparatus, comprising:
  an entropy encoder configured to selectively encode data items representing image data so as to generate encoded binarized symbols of successive output data units;
  the entropy encoder being configured to generate an output data stream subject to a constraint defining an upper limit to the number of binarized symbols that may be expressed by any individual output data unit relative to the size in bytes of that output data unit, in which the entropy encoder is configured to provide padding data, for each output data unit which does not meet the constraint, so as to increase the size in bytes of that output data unit in order to meet the constraint; the apparatus comprising:
an attribute detector configured to detect an encoding attribute applicable to a given output data unit; and
a selector configured to select, in response to the detected encoding attribute, a constraint, for use with the given output data unit, from two or more candidate constraints.

2. The apparatus of clause 1, in which the entropy encoder is configured to selectively encode data items representing image data to be encoded by a first, context adaptive binary arithmetic coding (CABAC), encoding system or by a second, bypass, encoding system, so as to generate the encoded binarized symbols.

3. The apparatus of clause 1, in which the image data representing one or more pictures;
each picture comprises data representing:
(i) one or more slices within respective network abstraction layer (NAL) units, each slice of a picture being decodable independently of any other slices of the same picture; and
(ii) zero or more tiles defining respective horizontal and vertical boundaries of picture regions and which are not constrained to be encapsulated within respective NAL units, the tiles being decodable independently of other tiles of the same picture; and
the output data units comprise one or more of pictures, slices and tiles.

4. The apparatus of clause 1 or clause 2, in which the second encoding system is a binary arithmetic coding system using a fixed 50% probability context model.

5. The apparatus of any one of the preceding clauses, in which the constraint is defined by:

$$N <= K1*B + (K2*CU)$$ (constraint equation 1)

in which:
N=number of binarized symbols in the output data unit;
K1 is a constant;
B=number of encoded bytes for the output data unit;
K2 is a variable dependent upon properties of minimum size coding units employed by the image data encoding apparatus; and
CU=size of the picture, slice or tile represented by the output data unit expressed as a number of coding units of minimum size.

6. The apparatus of clause 5, in which:
at least two candidate constraints are defined by the constraint equation 1, a respective set of (K1, K2) being associated with each of the at least two candidate constraints; and
the selector is configured to select a set of (K1, K2) for the given output data unit.

7. The apparatus of any one of the preceding clauses, in which:
the controller is configured to encode a representation of the encoding attribute applicable to the given output data unit in association with an output data stream representing the given output data unit.

8. The apparatus of clause 7, in which:
the image data encoding apparatus comprises a quantiser configured to selectively operate in a dependent quantisation mode; and
the encoding attribute indicates whether the dependent quantisation mode is enabled or disabled in respect of the given output data unit.

9. The apparatus of any one of the preceding clauses, in which the entropy encoder comprises:
a detector configured to detect, at a predetermined stage relative to the encoding of a current output data unit, whether the constraint will be met by the current output data unit; and
a padding data generator configured to generate and insert into the current output data unit sufficient padding data so that the output data unit including the inserted padding data meets the constraint.

10. The apparatus of clause 6, in which the predetermined stage is the end of encoding the current output data unit.

11. Video storage, capture, transmission or reception apparatus comprising apparatus according to any one of the preceding clauses.

12. An image data encoding method, comprising:
selectively encoding data items representing image data so as to generate encoded binarized symbols of successive output data units;
generating an output data stream subject to a constraint defining an upper limit to the number of binarized symbols that may be expressed by any individual output data unit relative to the size in bytes of that output data unit;
providing padding data, for each output data unit which does not meet the constraint, so as to increase the size in bytes of that output data unit in order to meet the constraint;
detecting an encoding attribute applicable to a given output data unit; and
selecting, in response to the detected encoding attribute, a constraint, for use with the given output data unit, from two or more candidate constraints.

13. Computer software which, when executed by a computer, causes the computer to carry out the method of clause 12.

14. A machine-readable non-transitory storage medium which stores the computer software of clause 13.

15. A data signal comprising coded data generated according to the method of clause 12.

16 An image data decoder configured to decode the data signal of clause 15.

The invention claimed is:
1. An image data encoding apparatus, comprising:
an entropy encoder configured to selectively encode data items representing image data so as to generate encoded binarized symbols of successive output data units;
the entropy encoder being configured to generate an output data stream subject to a constraint defining an upper limit to a number of binarized symbols that may be expressed by any individual output data unit relative to a size in bytes of that output data unit, in which the entropy encoder is configured to provide padding data, for each output data unit which does not meet the constraint, so as to increase the size in bytes of that output data unit in order to meet the constraint;
an attribute detector configured to detect an encoding attribute applicable to a given output data unit, the encoding attribute being a parameter or mode signaled by an encoding side; and a selector configured to select, in response to the detected encoding attribute, the constraint, for use with the given output data unit, from two or more candidate constraints.

2. The apparatus of claim 1, wherein the entropy encoder is configured to selectively encode data items representing image data to be encoded by a first, context adaptive binary arithmetic coding (CABAC) encoding system or by a second, bypass, encoding system, so as to generate the encoded binarized symbols.

3. The apparatus of claim 1, wherein the image data representing one or more pictures;
each picture comprises data representing:
(i) one or more slices within respective network abstraction layer (NAL) units, each slice of a picture being decodable independently of any other slices of the same picture; and
(ii) zero or more tiles defining respective horizontal and vertical boundaries of picture regions and which are not constrained to be encapsulated within respective NAL units, the tiles being decodable independently of other tiles of the same picture; and
the output data units comprise one or more of pictures, slices and tiles.

4. The apparatus of claim 2, wherein the second encoding system is a binary arithmetic coding system using a fixed 50% probability context model.

5. The apparatus of claim 1, wherein
the entropy encoder is configured to encode a representation of the encoding attribute applicable to the given output data unit in association with an output data stream representing the given output data unit.

6. The apparatus of claim 5, wherein
the image data encoding apparatus comprises a quantiser configured to selectively operate in a dependent quantisation mode; and
the encoding attribute indicates whether the dependent quantisation mode is enabled or disabled in respect of the given output data unit.

7. The apparatus of claim 1, wherein the entropy encoder comprises:
a detector configured to detect, at a predetermined stage relative to the encoding of a current output data unit, whether the constraint will be met by the current output data unit; and
a padding data generator configured to generate and insert into the current output data unit sufficient padding data so that the output data unit including the inserted padding data meets the constraint.

8. The apparatus of claim 7, wherein the predetermined stage is an end of encoding the current output data unit.

9. A video storage, capture, transmission or reception apparatus comprising the apparatus according to claim 1.

10. An image data encoding method, comprising:
selectively encoding data items representing image data so as to generate encoded binarized symbols of successive output data units;
generating an output data stream subject to a constraint defining an upper limit to a number of binarized symbols that may be expressed by any individual output data unit relative to a size in bytes of that output data unit;
providing padding data, for each output data unit which does not meet the constraint, so as to increase the size in bytes of that output data unit in order to meet the constraint;
detecting an encoding attribute applicable to a given output data unit, the encoding attribute being a parameter or mode signaled by an encoding side; and
selecting, in response to the detected encoding attribute, a constraint, for use with the given output data unit, from two or more candidate constraints.

11. A non-transitory computer readable medium including computer program instructions, which when executed by a computer causes the computer to perform the method of claim 10.

12. An image data decoding method, comprising:
processing encoded image data, the image data comprising padding data used to meet the encoding constraint and encoded based on selecting one constraint from the two or more candidate constraints according to the image data encoding method of claim 10.

13. A non-transitory computer readable medium including computer program instructions, which when executed by a computer causes the computer to perform the method of claim 12.

14. An image data decoding apparatus, comprising:
buffer circuitry configured to receive entropy encoded binarized symbols of data units subjected to different constraints, the different constraints defining an upper limit to a number of binarized symbols that may be expressed by any individual data unit relative to a size in bytes of that data unit and in the event of a data unit not meeting an applied constraint, the data unit having being provided with padding data to meet the applied constraint, the applied constraint having been selected from the different constraints based on an encoding attribute representing an encoding mode or profile; and
circuitry including a context adaptive binary arithmetic coding (CABAC) decoder and bypass decoder, the circuitry being configured to receive and decode the entropy encoded binarized symbols of data units from the buffer circuitry and output image data therefrom.

15. The image data decoding apparatus of claim 14, wherein the encoding mode or profile is an encoding tier.

16. The image data decoding apparatus of claim 15, wherein the entropy encoded binarized symbols of data units represent image data of a lower encoding tier and the applied constraint is lower for a lower encoding tier than for image data of a higher encoding tier.

17. The image data decoding apparatus of claim 14, the applied constraint has been formed, in part, based on a flag value.

18. The image data decoding apparatus of claim 14, the applied constraint is, in part, based on an implicit flag value.

19. A video storage, capture, transmission or reception apparatus comprising the image data decoding apparatus according to claim 14.

* * * * *